United States Patent [19]
Yoshino et al.

[11] Patent Number: 5,617,026
[45] Date of Patent: Apr. 1, 1997

[54] QUIET MAGNETIC RESONANCE IMAGING APPARATUS

[75] Inventors: Hitoshi Yoshino; Hiroshi Nishimura, both of Kashiwa, Japan

[73] Assignee: Hitachi Medical Corporation, Tokyo, Japan

[21] Appl. No.: 307,242

[22] Filed: Sep. 16, 1994

[30] Foreign Application Priority Data

| Sep. 17, 1993 | [JP] | Japan | 5-253634 |
| Apr. 6, 1994 | [JP] | Japan | 6-068732 |
| Jul. 29, 1994 | [JP] | Japan | 6-179193 |
| Aug. 2, 1994 | [JP] | Japan | 6-181560 |

[51] Int. Cl.$^6$ ............................... G01V 3/00; G01V 3/14
[52] U.S. Cl. ............................... 324/318; 324/322
[58] Field of Search .................. 324/318, 322; 73/772; 364/413.13, 418.15, 413.19; 188/1 B; 244/1 N; 267/140.15

[56] References Cited

U.S. PATENT DOCUMENTS

| 4,083,433 | 4/1978 | Geohegam, Jr. et al. | 188/1 B |
| 4,680,545 | 7/1987 | Gray et al. | |
| 4,715,559 | 12/1987 | Fuller | 244/1 N |
| 5,022,272 | 6/1991 | Bronowicki et al. | |
| 5,235,283 | 8/1993 | Lehne et al. | 324/318 |
| 5,236,186 | 8/1993 | Weltin et al. | 267/140.15 |
| 5,278,504 | 1/1994 | Patrick et al. | 324/318 |
| 5,331,281 | 7/1994 | Otsuka | 324/318 |
| 5,345,177 | 10/1994 | Sato et al. | 324/318 |
| 5,370,340 | 12/1994 | Pla | 244/1 N |
| 5,382,134 | 11/1995 | Pla et al. | 244/1 N X |
| 5,391,053 | 2/1995 | Pla et al. | 244/1 N X |
| 5,458,222 | 10/1995 | Pla et al. | 324/318 X |

FOREIGN PATENT DOCUMENTS

| 0431216A1 | 6/1991 | European Pat. Off. |
| 4141514A1 | 8/1992 | Germany |
| A270195 | 3/1990 | Japan |
| WO880912 | 4/1988 | WIPO |

OTHER PUBLICATIONS

"Klinische Kernspintomographic", DE Book, J. Lissner, et al, Ferdinand Enke Verlag, Stuttgart 1990, pp. 121–133.
"Brockhaus, abc Physik", DD Book, R. Lenk, et al, Brockhaus Verlag, Leipzig 1972, pp. 387 and 1163–1165.

Primary Examiner—Sandra L. O'Shea
Assistant Examiner—Mack Haynes
Attorney, Agent, or Firm—Antonelli, Terry, Stout & Kraus, LLP

[57] ABSTRACT

A gradient magnetic field generation apparatus for generating a gradient magnetic field in a space in which an inspection object is placed includes at least one gradient magnetic field coil and a retaining member of the coil which undergoes deformation vibration by an electromagnetic force generated when a current is caused to flow through the coil. This apparatus generates noise and vibration whenever a pulse current is applied to the coil, because an electromagnetic force develops in the coil due to the pulse current and the coil as well as the retaining member of the coil undergo deformation and vibration. Therefore, a force which inhibits this deformation and vibration is applied to the retaining member so as to prevent deformation and vibration of the coil and the retaining member and to keep their shapes constant. In a preferred embodiment, a piezoelectric device is fixed to the retaining member without damping, and the force for inhibiting deformation and vibration of the retaining member is applied by controlling a voltage applied to the piezoelectric device.

42 Claims, 14 Drawing Sheets

F I G. 10
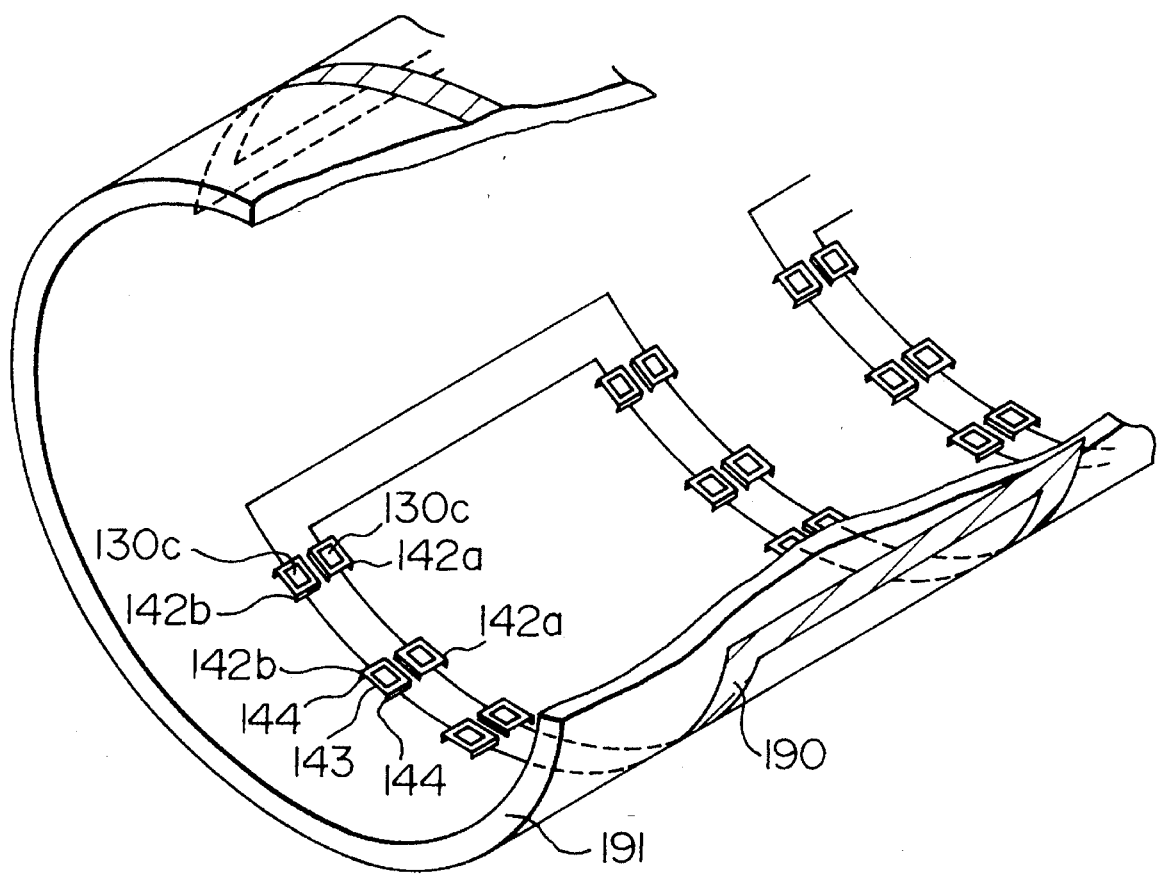

QUIET MAGNETIC RESONANCE IMAGING APPARATUS

BACKGROUND OF THE INVENTION

This invention relates to a quiet magnetic resonance imaging apparatus (hereinafter referred to as the "MRI apparatus"). More particularly, it relates to an improvement in a gradient magnetic field generation apparatus.

The MRI apparatus irradiates electromagnetic waves to an inspection object placed in a static magnetic field to generate a nuclear magnetic resonance phenomenon in the atomic nuclei of the inspection object and acquires images representing the physical properties of the inspection object on the basis of magnetic resonance signals generated from the inspection object. Generally, the MRI apparatus comprises magnetic field generation means for generating a static magnetic field and a gradient magnetic field, respectively, a radio frequency coil for irradiating electromagnetic waves to the inspection object or detecting nuclear magnetic resonance (NMR) signals from the inspection object and image reconstruction means for reconstructing images by using the NMR signals so detected. The gradient magnetic field is applied in superposition with the static magnetic field so as to add position information to the NMR signal, and comprises a gradient magnetic field coil positioned inside the magnetic field generated by the static magnetic field generation means and a retaining member of the coil. It is driven when a pulsatile current is caused to flow through the gradient magnetic field coil. In this case, when a pulse current is caused to flow inside the magnetic field, an electromagnetic force acts in accordance with the Fleming's left-hand rule. This electromagnetic force causes deformation of the gradient magnetic field coil and generates noise and vibration from the static magnetic field generation apparatus. Sound-proofing or silencing of this noise is preferably effected because they impart fear and offensive feeling to a patient as the inspection object.

Accordingly, the conventional MRI apparatuses employ the system which reduces the noise of the gradient magnetic field by disposing a sound-proofing member, etc., inside a decorative cover which covers the outer periphery of the apparatus, uses a vibration-proofing material for the retaining member for holding the gradient magnetic field coil, reduces the absolute value of the amplitude of vibration by utilizing damping characteristics of the vibration-proofing member, and shortens the damping time (refer to WO 88/02912).

On the other hand, an active silencing method is known as the method of reducing various kinds of noises. This method generates a sound wave having an opposite phase to that of the noise but having the same amplitude, from an additional sound source so as to cancel the noise. A variety of methods of this kind have been proposed depending on the kinds of noises, and attempts have been made to apply these methods to the MRI apparatus.

For example, JP-A-2-70195 describes a silencing method which generates a sound from an acoustic speaker so as to minimize energy of an output signal of an acoustic sensor disposed on the downstream side of a propagation path by using the output of an acoustic sensor for detecting information of sound waves from a noise source side as a reference signal, as a technology of effecting active sound cancellation inside the propagation path of the sound source.

Further, U.S. Pat. No. 5,022,272 describes a method which detects vibration of the apparatus by using a piezoelectric device, and generates vibration having an opposite phase to that of the vibration detected to offset the vibration.

SUMMARY OF THE INVENTION

It is an object of the present invention to provide a novel sound- and vibration-proofing system for a gradient magnetic field generation apparatus of an MRI apparatus.

The causes of noise and vibration of the gradient magnetic field generation apparatus are considered to be as follows. When a current is applied to a gradient magnetic field coil, an electromagnetic force acts on the coil and the coil undergoes deformation. The coil is generally retained by a bobbin made of a resin, and deformation of the coil due to the electromagnetic force invites also deformation of the bobbin. The current applied to the coil is pulsatile (applied two to ten times per second) and its polarity changes, as well. For this reason, deformation of the coil and the bobbin due to the electromagnetic force naturally changes whenever the pulsatile current is applied. In other words, this deformation is not static, and noise and vibration are considered to occur whenever this deformation occurs.

Accordingly, the present invention effectively suppresses deformation and vibration of the coil and the bobbin by applying a force, which inhibits this deformation and vibration, to the bobbin whenever deformation occurs, or in other words, in synchronism with the application of the pulse current to the coil.

As described above, deformation of the coil and the bobbin so occurs as to respond to the pulse current. Accordingly, the force to be applied to the bobbin in order to inhibit deformation must be changed in synchronism with the pulse current. A preferred embodiment of the invention uses a piezoelectric device as means for applying the force. The piezoelectric device is firmly fixed to the bobbin. The direction of deformation of the piezoelectric device is substantially parallel to the plane of the bobbin, and the force in this direction is applied from the piezoelectric device to the bobbin. On the other hand, the electromagnetic force acts in the normal direction of the plane of the bobbin. Because the direction of the electromagnetic force and the direction of the force of the piezoelectric device are thus different, the piezoelectric devices must be disposed throughout the entire surface of the bobbin without substantial gaps in order to inhibit deformation and vibration of the bobbin and to keep its shape.

To precisely control the force to be applied to the bobbin, it is preferred to impart directivity to deformation of the piezoelectric device and to allow the device to undergo deformation preferentially in only one direction. To accomplish this object, a preferred embodiment of the invention sets the direction of polarization of the piezoelectric device to be parallel with the bobbin. The force to be applied to the bobbin can be controlled more precisely by disposing preferably alternately first piezoelectric devices the preferential deformation direction of which lies in the axial direction of the bobbin and second piezoelectric devices the preferential deformation direction of which lies in the circumferential direction of the bobbin on the entire surface of the bobbin.

The piezoelectric device must be fitted to the bobbin without damping. To attain this object, the piezoelectric device is preferably buried in the bobbin by molding, for example. An epoxy type adhesive, for example, is used for fitting the piezoelectric devices to the bobbin from outside.

Deformation of each of the piezoelectric devices fitted to the entire surface of the bobbin is independently controlled.

Alternatively, deformation of a plurality of piezoelectric devices can be controlled in bulk. The unit of control can be selected appropriately in accordance with the degree of deformation of the bobbin.

In a preferred embodiment of the invention, the piezoelectric devices fixed to the bobbin are used as means for detecting deformation of the bobbin, and the voltages to be applied to the piezoelectric devices are controlled by feedback control on the basis of the detection result. The piezoelectric devices for detection and those for applying the force to the bobbin may the separate or the same. In the latter case, deformation information of the bobbin so detected is once stored in a memory.

The deformation quantities of the coil and bobbin are primarily determined by the coil characteristics, the intensity of the pulse current, the current application time and its polarity. Accordingly, the force necessary for offsetting the deformation and vibration can also be determined. In other words, the voltage to be applied to the piezoelectric device is controlled on the basis of the pulse current, and deformation and vibration of the coil and the bobbin can be inhibited.

Also, there is the case where the sequence of the pulse currents is in advance determined depending on the inspection object. In such a case, the sequence of deformation of the coil and the bobbin can be determined in the same way as described above, and the sequence of the voltages to be applied to the piezoelectric devices to as to inhibit the sequence of this deformation and vibration can be determined. Accordingly, this sequence of the voltages is preserved in advance, and when the constant sequence of the pulse current is adopted, this voltage sequence is used so as to inhibit deformation and vibration of the bobbin.

Piezoelectric ceramics such as a $BaTiO_3$ system or a $PbZrO_3$-$PbTiO_3$ system are used for the piezoelectric device.

BRIEF DESCRIPTION OF THE DRAWINGS

These and other object and technical advantages of the present invention will be readily apparent from the following description of the preferred exemplary embodiments of the invention in conjunction with the accompanying drawings, in which:

FIG. 10 is a perspective view of a gradient magnetic field generation apparatus according to the fourth embodiment;

DESCRIPTION OF THE PREFERRED EMBODIMENTS

Hereinafter, preferred embodiments of the present invention will be described in detail with reference to the accompanying drawings.

Figure 1:
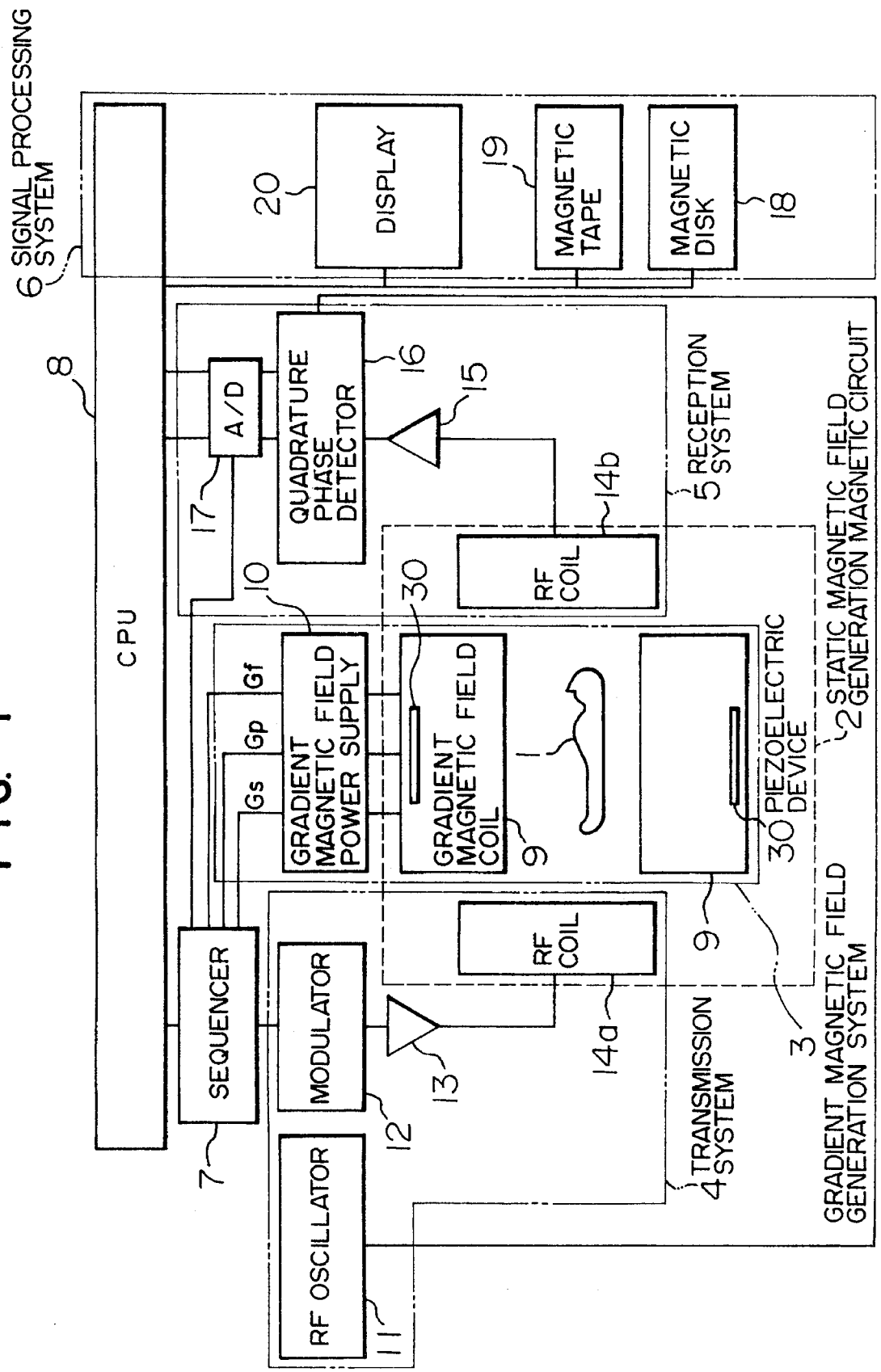
FIG. 1 is an explanatory view useful for explaining the construction of a magnetic resonance imaging apparatus (hereinafter referred to as the "MRI apparatus") according to an embodiment of the present invention.

FIG. 1 is a block diagram showing the overall construction of the MRI apparatus according to an embodiment of the present invention. This MRI apparatus acquires a sectional image (tomogram) of a subject 1 by utilizing a nuclear magnetic resonance (NMR) phenomenon and to accomplish this object, the MRI apparatus includes a static magnetic field generation magnetic circuit 2 having a sufficiently large bore diameter, a central processing unit (hereinafter referred to as the "CPU") 8, a sequencer 7, a transmission system 4, a gradient magnetic field generation system 3, a reception system 5 and a signal processing system 6.

The static magnetic field generation magnetic circuit 2 generates a uniform or homogeneous magnetic flux around the subject 1 in its body axis direction or in a direction orthogonal to the body axis direction, and magnetic field generation means of a permanent magnet system, a normal conduction system or a superconducting system is disposed inside a space around the subject 1 having certain expansion.

The sequencer 7 operates under control of the CPU 8 and sends various instructions necessary for collecting data of the tomographic images of the subject 1 to the transmission system 4, the gradient magnetic field system 3 and the reception system 5.

The transmission system 4 comprises a radio frequency (RF) oscillator 11, a modulator 12, an RF amplifier 13 and an RF coil 14a on the transmission side. The RF pulse outputted from the RF oscillator 11 is subjected to amplitude modulation by the modulator 12 in accordance with the instruction of the sequencer 7. After being amplified by the RF amplifier 13, this amplitude-modulated RF pulse is supplied to the RF coil 14a disposed in the promixity of the subject 1, so that the electromagnetic waves are irradiated to the subject 1.

The gradient magnetic field generation system 3 comprises gradient magnetic field coils 9 wound in X, Y, Z three directions and gradient magnetic field power supply 10 for driving these coils, respectively, and when the respective gradient magnetic field power supply 10 is driven in accordance with the instruction from the sequencer 7, each of the gradient magnetic fields Gx, Gy, Gz in the X, Y, Z three directions is applied to the subject 1. The plane or slice to the subject 1 can be set by the mode of application of the gradient magnetic field.

The reception system 5 comprises an RF coil 14b on the reception side, an amplifier 15, a quadrature phase detector 16 and an A/D convertor 17. The responsive electromagnetic waves of the subject (NMR signals) to the electromagnetic waves irradiated from the RF coil 14a on the transmission side are detected by the RF coil 14b disposed in the proximity of the subject 1, are inputted to the A/D convertor 17 through the amplifier 15 and the quadrature phase detector 16, and are thus converted to digital quantities. In this instance, the A/D convertor 17 samples two series of signals outputted from the quadrature phase detector 16 at the timing indicated by the instruction from the sequencer 7 and outputs two series of digital data. These digital signals are sent to the signal processing system 6 and are subjected to Fourier transform.

The signal processing system 6 comprises the CPU 8, a recording unit such as a magnetic disk 18 and a magnetic tape 19, and a display 20 such as a CRT, executes various processings such as Fourier transform, calculation of correction coefficients, image reconstruction, etc., by using the digital signals described above, performs appropriate arithmetic operations for a signal intensity distribution of an arbitrary slice or for a plurality of signals, converts the resulting distribution to images and displays the images on the display 20.

By the way, the RF coils 14a, 14b on the transmission and reception sides and the gradient magnetic field coil 9 in FIG. 1 are disposed inside the magnetic space of the static magnetic field generation magnetic circuit 2 which is in turn disposed inside the space around the subject 1. Reference numeral 30 in the drawing denotes a piezoelectric device for converting electrical energy to mechanical energy, provided to the gradient magnetic field coil 9.

Next, an embodiment of the structure of the gradient magnetic field coil as one of the characterizing features of the present invention will be explained.

Figure 2:
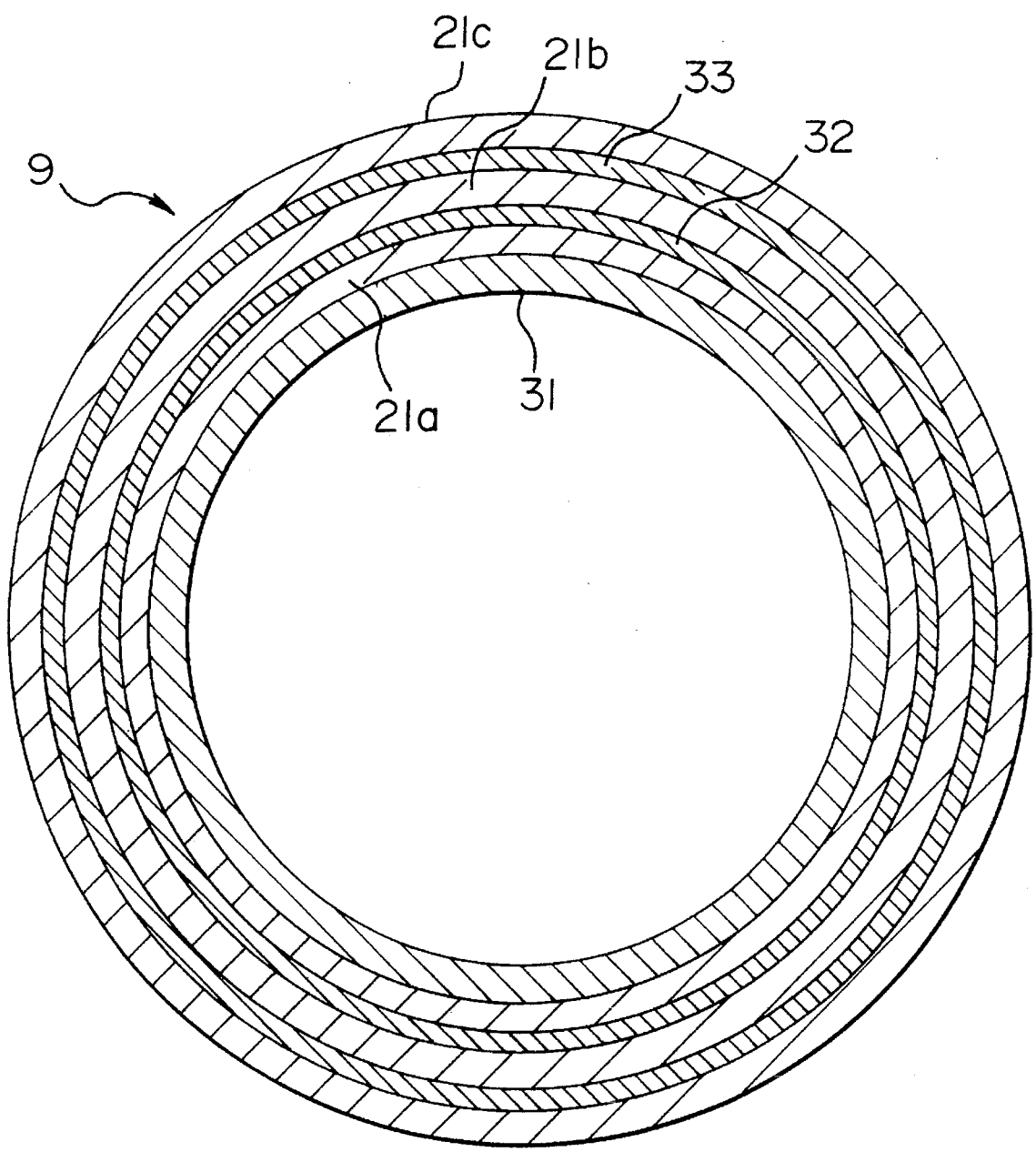
FIG. 2 is a sectional view of a gradient magnetic field generation apparatus according to the first embodiment.

FIG. 2 is a transverse sectional view of a cylindrical gradient magnetic field coil. An X gradient magnetic field coil conductor 21a, a Y gradient magnetic field coil conductor 21b and a Z gradient magnetic field coil conductor 21c for generating magnetic field which linearly change in the X, Y and Z directions comprise a bobbin 31 made of FRP (fiber reinforced plastics) and a piezoelectric device (not shown in the drawing). The X gradient magnetic field coil conductor 21a is fixed to the outer periphery of the bobbin 31 by an epoxy resin type adhesive, and the Y gradient magnetic field coil conductor 21b is fixed to the outer periphery of the coil conductor 21a through an insulating sheet 32. Further, the Z gradient magnetic field coil conductor 21c is fixed by an adhesive to the outer periphery of the Y gradient magnetic field coil conductor 21b through an insulating sheet 33.

Figure 3:
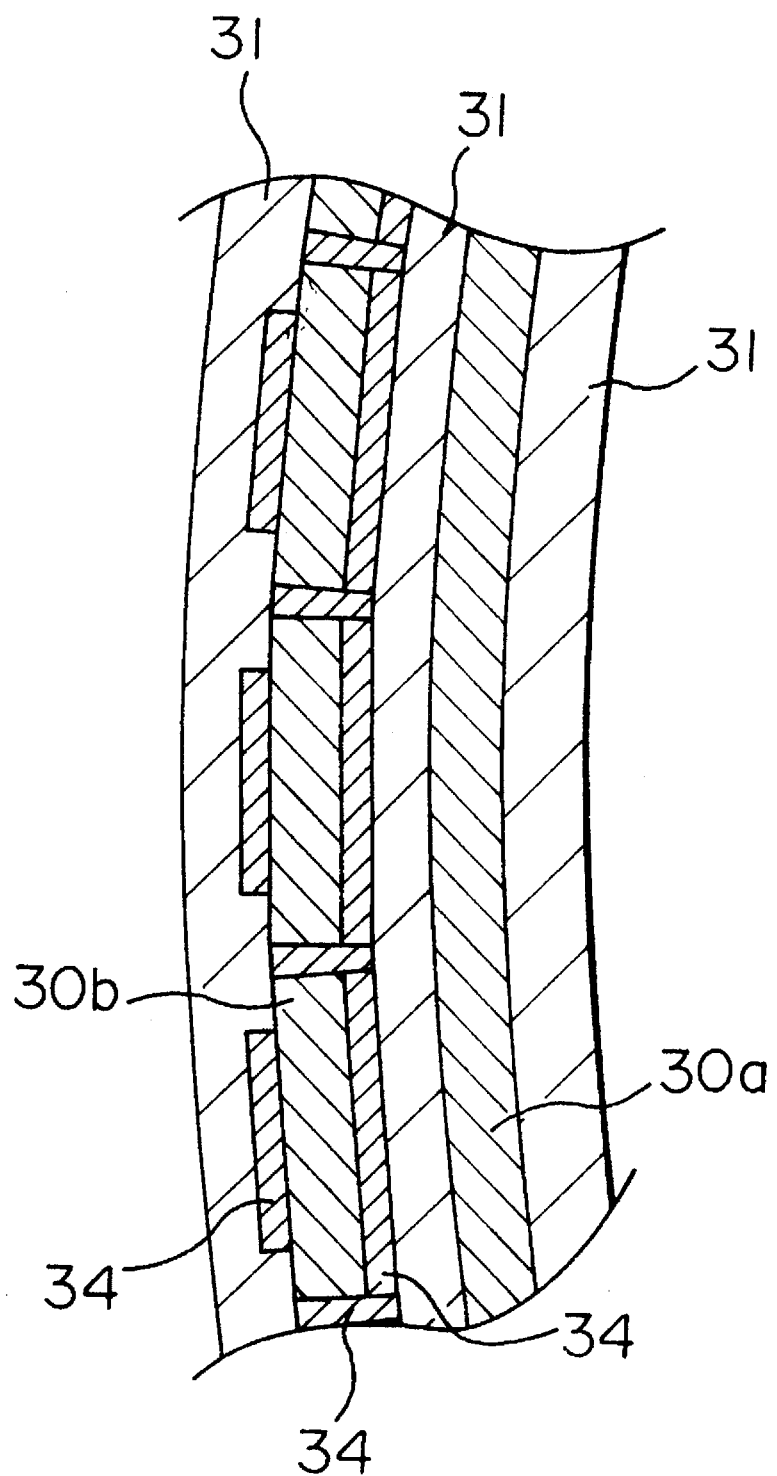
FIG. 3 is a partial enlarged sectional view of the gradient magnetic field generation apparatus.

FIG. 3 is an enlarged view of only the bobbin 31 in FIG. 2, and shows the piezoelectric device 30 which is for converting electrical energy to mechanical energy and is molded in the bobbin 31. Two kinds of piezoelectric devices are integrated with the bobbin 31. In other words, a device 30a is fixed to the bobbin 31 in such a manner that its entire surface is in contact with the bobbin 31, and a device 30b, having a low flexible member 34 which is in contact with a central portion of one of the surfaces of the device 30b and with the entire surface on the opposite side and with the end surfaces, is fixed in such a manner that only its portions sandwiching the central portion of the one of the surfaces are in contact with the bobbin 31. The low flexible member 34 is preferably a closed cell sponge, or the like. The piezoelectric device may be divided on the circumference or may be integral. In this embodiment, both piezoelectric devices 30a, 30b expand and contract in the circumferential direction or in the tangential direction. In the piezoelectric device 30b, deformation of the portion not fixed to the bobbin 31 is absorbed by the sponge. In other words, deformation at this portion is allowed to escape to the sponge.

Figure 4:
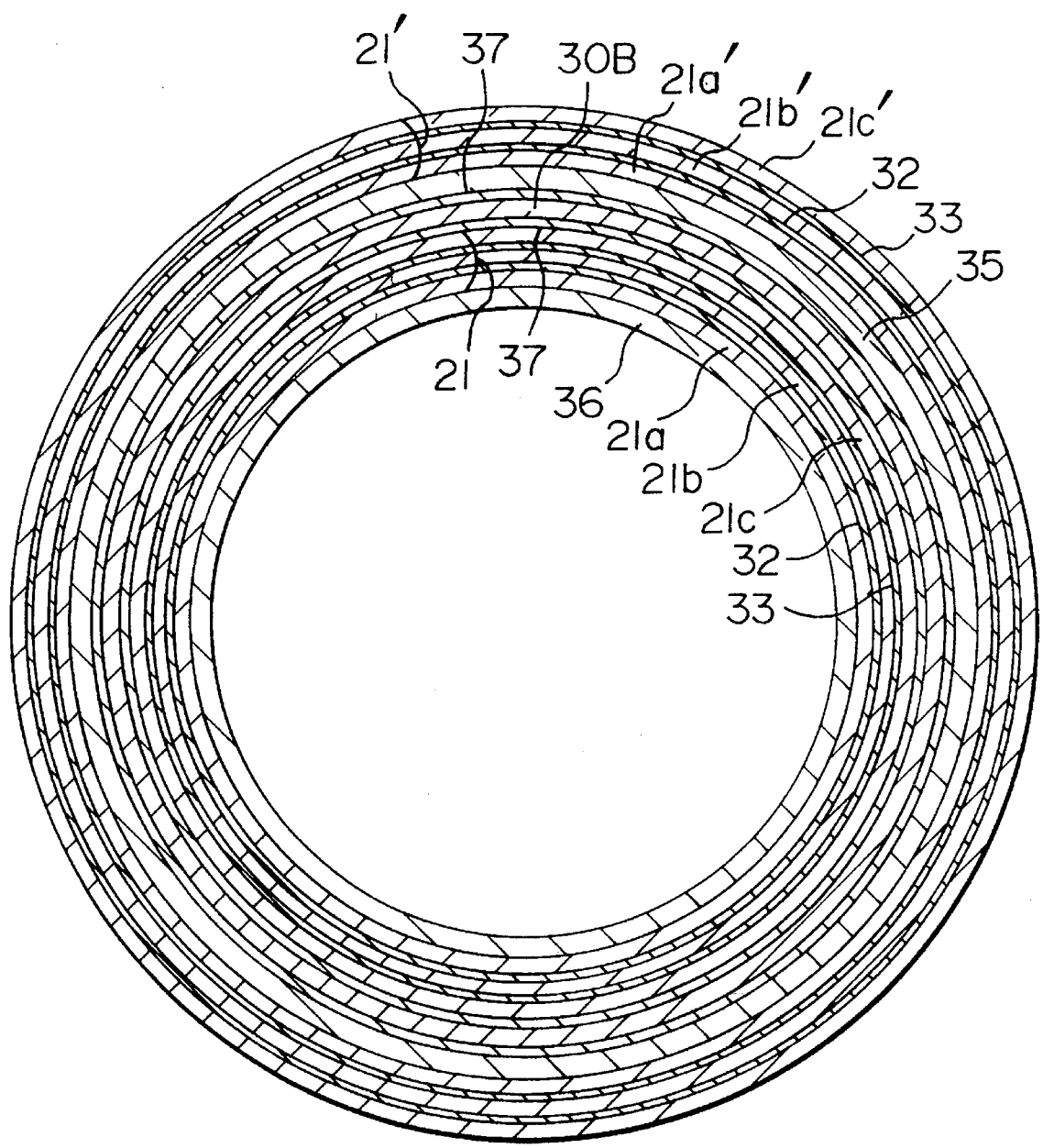
FIG. 4 is a sectional view of a gradient magnetic field generation apparatus according to the second embodiment.

FIG. 4 is a structural view of the gradient magnetic field coil according to the second embodiment of the present invention. This drawing, too, is a transverse sectional view of a cylindrical gradient magnetic field coil. In this embodiment, the gradient magnetic field coil comprises a main coil 21 and a shield coil 21', and both of the main coil 21 and the shield coil 21' have each coil for generating a magnetic field which linearly changes in each of X, Y and Z directions. A shield bobbin 35 for supporting the shield coil 21' is made of FRP, and an X shield coil conductor 21a' is fixed by an epoxy resin adhesive to the outer periphery of the bobbin 35. A Y shield coil conductor 21b' is fixed to the outer periphery of the shield coil conductor 21a' through an insulating sheet 32 and a Z shield coil conductor 21c' is fixed by an adhesive to the outer periphery of the shield coil conductor 21b' through an insulating sheet 33. A main bobbin 36 for supporting the main coil 21, too, is made of FRP, and an X gradient magnetic field coil conductor 21a, a Y gradient magnetic field conductor 21b and a Z gradient magnetic field conductor 21c are constituted in the same way as the shield coil 21' described above. The piezoelectric device 30B having the same function as that of the first embodiment is so disposed as to define a gap between the shield coil 21' and the main coil 21. When a non-magnetic and electrically non-conductive resin 37 is charged into the gap, all the structural members are integrated with one another. The piezoelectric device 30B comprises a device fixed while keeping contact with the resin 37 throughout its entire surface, and a device whose low flexible member is in contact with the central portion of one of the surfaces and is fixed while only the end portion is in contact with the resin 37 in the same way as in the first embodiment, and is integrated by the resin 37. The piezoelectric device 30B may be divided on the circumference or may be integral.

Figure 5:
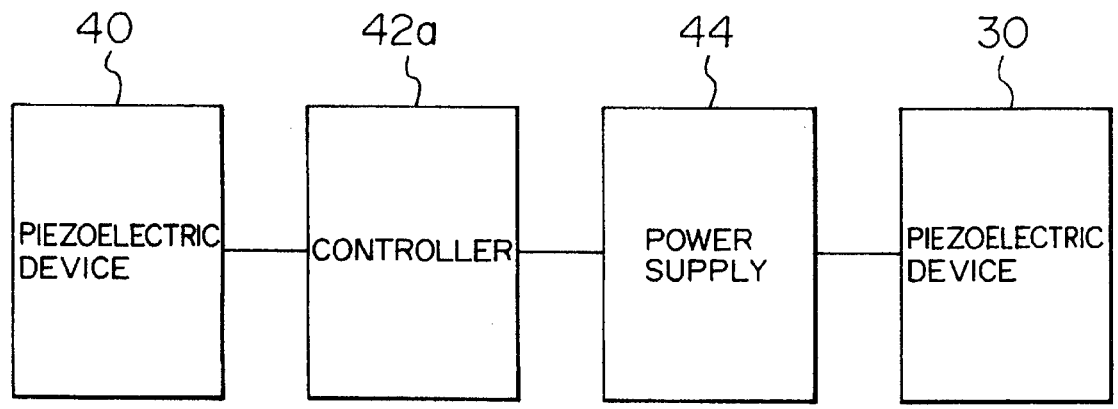
FIGS. 5 and 6 are explanatory views useful for explaining the control method of a piezoelectric device.

FIG. 5 is a block diagram of an embodiment which controls a voltage to be applied to the piezoelectric device 30. This embodiment detects deformation of the gradient magnetic field coil and controls the voltage applied to the piezoelectric device 30 in accordance with the detection value. A piezoelectric device 40 for converting electrical energy to mechanical energy is disposed in the proximity of the piezoelectric device 30 described above, and detects deformation of the bobbin generated by electromagnetic force which is in turn generated when a current is caused to flow through the gradient magnetic field coil. This device 40 outputs a voltage proportional to the quantity of deformation. A controller 42a converts this voltage to a digital value from an analog value, applies a weight coefficient, outputs a digital quantity of the voltage applied to the piezoelectric device 30 so that the value becomes zero, and drives the power supply 44. The piezoelectric device 30 is driven by the output of the controller 42a. Low vibration and low noise can be accomplished more effectively by dispersing a plurality of piezoelectric device 40 inside the bobbin in this case. Preferably, the piezoelectric device 40 comprises a device fixed to the bobbin throughout its entire surface and a device which disposes the low flexible member at the center and is fixed to the bobbin only at its end portion, in the same way as the piezoelectric device 30 in the first embodiment.

The deformation quantity of the bobbin can be detected by the piezoelectric device 30. In this case, the deformation quantity is once stored in a memory inside the controller 42a. The voltage is applied to the piezoelectric device 30 by looking up this deformation quantity and the bobbin is allowed to undergo deformation.

Figure 6:
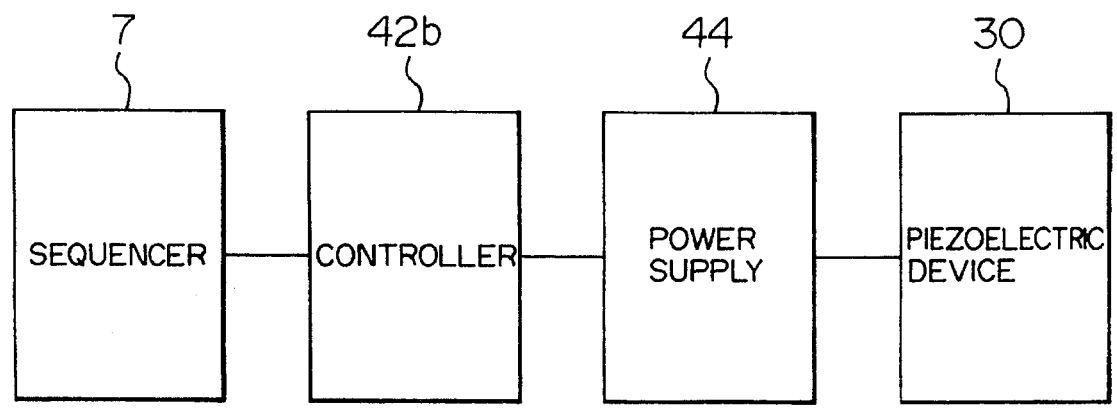

FIG. 6 is a block diagram showing another example for controlling the voltage to be applied to the piezoelectric device 30. In this embodiment, gradient magnetic field driving information of the sequencer 7, that is, the pulse current applied to the gradient magnetic field coil, is inputted to the controller 42 and after a weight is applied to this value, the signal is used for driving the power supply so as to apply the voltage to the piezoelectric device 30. Among the information of the sequencer 7, it is the gradient magnetic field intensity, the application timing and the application axis that are utilized. The weighting quantity is determined in the following way. A voltage at each portion of the piezoelectric device occurring when it is driven in advance at a certain gradient magnetic field intensity (Go) in only the X direction is subjected to A/D conversion, and the value is stored in the memory of the controller 42b. The same procedure is carried out in the same way in the cases of the Y and Z gradient magnetic fields, and a proportion (weighting quantity) of the voltage to be applied to each piezoelectric device with driving of the gradient magnetic field of each axis is determined. The value so obtained is stored in the memory. It will be hereby assumed that the weighting quantities of a certain piezoelectric device determined by driving each axis are $k_1x$, $k_2y$ and $k_3z$. When a practical imaging sequence is executed, there are many cases where a plurality of gradient magnetic fields are simultaneously applied. If the intensity of the gradient magnetic field at the time of imaging is G and the gradient magnetic fields are applied simultaneously to three axes, the voltage applied to one piezoelectric device 30 is given by $$-G(k_1x+k_2y+k_3z)/Go$$

This voltage is applied at the timing based on the output of the signal of the sequencer 7. Also, there is the case where the application sequence of the gradient magnetic fields is determined in advance depending on the subject to be inspected. In such a case, the sequence of a voltage $-G(k_1x+k_2y+k_3z)/Go$ is determined in advance, too. Accordingly, this voltage sequence is stored in the memory of the controller, and deformation of the piezoelectric device is controlled on the basis of this voltage sequence.

Figure 7:
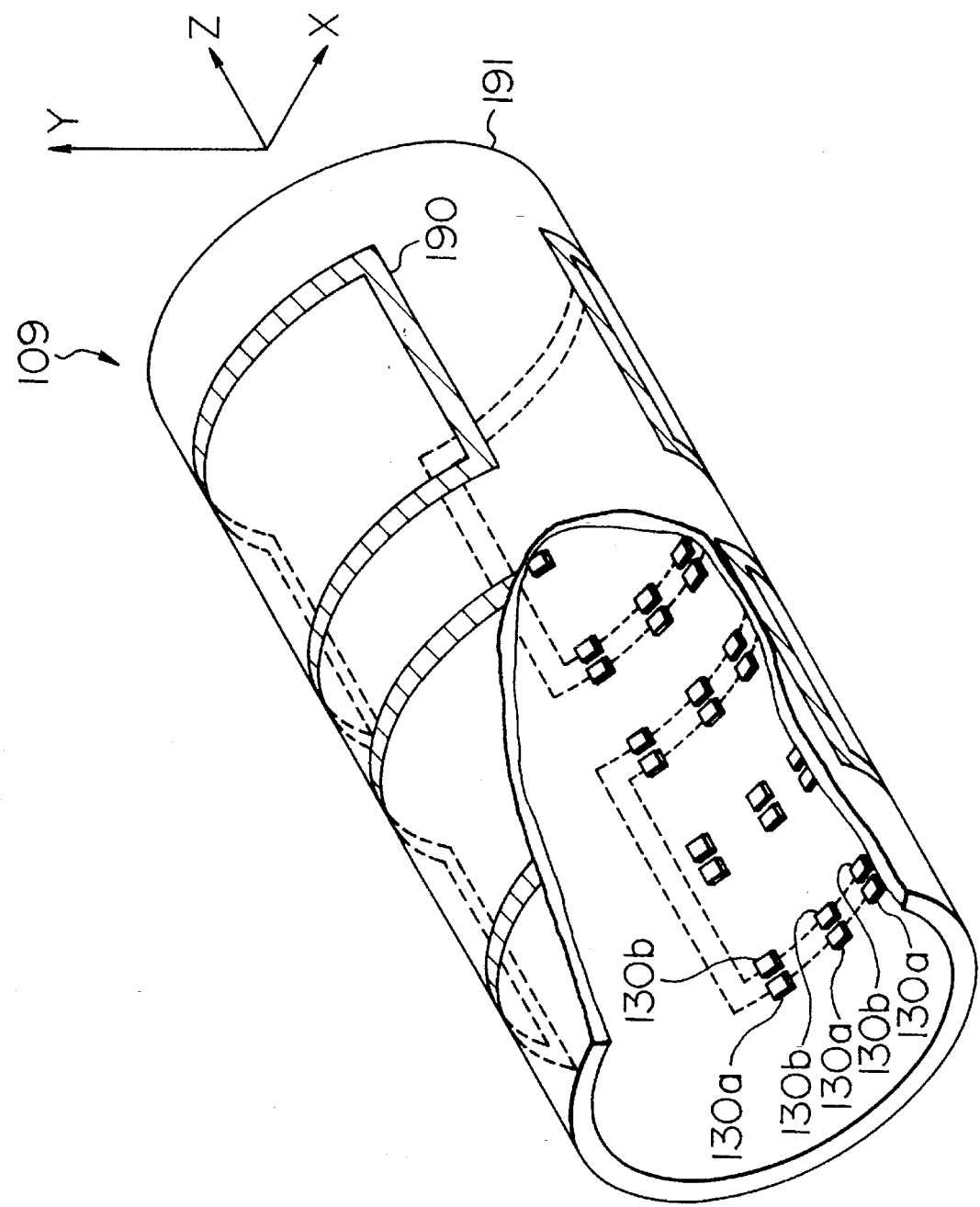
FIG. 7 is a perspective view of a gradient magnetic field generation apparatus according to the third embodiment.

FIG. 7 is a perspective view of a cylindrical gradient magnetic field coil according to the third embodiment of the present invention, and a part of the coil is shown cut away for ease of explanation. In this embodiment, the gradient magnetic field coil 109 comprises gradient magnetic field coil conductors 190 for generating the magnetic fields which linearly change in the X, Y and Z direction, a bobbin 191 made of FRP as a retaining member for retaining these coil conductors and piezoelectric devices 130a and 130b disposed in such a manner that conversion efficiency is different depending on the directions.

In this drawing, only the Y gradient magnetic field coil conductor 190 among the coil conductors is shown, and the X- and Z gradient magnetic field coil conductors are omitted from the drawing. Each gradient magnetic field coil conductor is fixed to the bobbin 191 by bonding or screwing. When the gradient magnetic field coil conductor undergoes deformation and vibration due to the electromagnetic force acting on the gradient magnetic field coil conductor when the gradient magnetic field coil is driven, the bobbin 191 undergoes deformation and vibration integrally with the coil conductor.

The piezoelectric device 130 (130a, 130b) is a conversion device which converts electrical energy to mechanical energy and vice versa, and its conversion efficiency is greater in the direction of polarization than in the other directions. In this embodiment, therefore, one 130a of the piezoelectric devices is disposed so that conversion efficiency in the axial direction (Z direction) becomes greater, that is, in such a manner that the direction of polarization lies in the axial direction, and the other piezoelectric device 130b is disposed so that conversion efficiency in the circumferential direction becomes greater, that is, in such a manner that the direction of polarization lies in the circumferential direction. According to this arrangement, a strain can be imparted only and substantially in the direction of polarization when a voltage is applied to the piezoelectric device in order to cancel the electromagnetic force.

Figure 8:
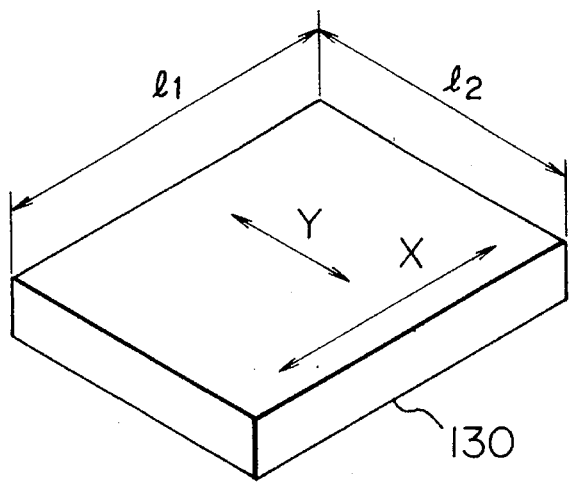
FIG. 8 is an explanatory view showing a piezoelectric device the direction of polarization of which orthogonally crosses a retaining member.
Figure 9:
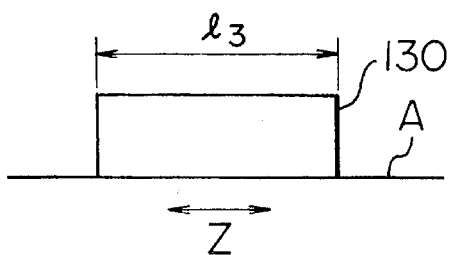
FIG. 9 is an explanatory view showing a piezoelectric device the direction of polarization of which is in parallel with a retaining member.

In other words, when the bobbin in the proximity of the Y gradient magnetic field coil conductor 190 shown in FIG. 7 undergoes deformation, the strain in the axial direction and the strain in the circumferential direction have mutually opposite polarities but have substantially the same absolute value. In this case, according to the arrangement wherein the direction of the polarization is vertical to the disposition plane A as shown in FIG. 8, the phenomenon in which the strain in the Y direction is promoted, on the contrary, can occur when a voltage is applied so as to cancel the strain in the X direction. In other words, there is the case where deformation of the bobbin cannot be effectively offset. The strains can be separately imparted in two directions by combining the piezoelectric devices 30a, 30b whose directions of polarization are in parallel with the disposition plane of the piezoelectric devices (see FIG. 9) and are mutually different directions. According to this arrangement, offsetting efficiency of vibration of the bobbin deformation can be improved.

As described above, the piezoelectric device 130 is bonded to the bobbin 191 by the adhesive having small damping. Preferably, a plurality of piezoelectric devices 130 are dispersedly arranged inside the bobbin and by so doing, low vibration and low noise can be accomplished more effectively. When information on deformation of the bobbin 191 is given in advance, the piezoelectric device or devices 130 can be selectively disposed at the position(s) where the bobbin 191 is particularly likely to undergo deformation. In this embodiment, the piezoelectric device 131 is so disposed as to extend along the gradient magnetic field coil conductor.

The piezoelectric device 130 disposed in the manner described above can be used as an actuator which converts electrical energy to mechanical energy by the application of the voltage and cancels the electromagnetic force of the gradient magnetic field coil conductor, but can also be used as a detection device for detecting deformation by converting the strain of the bobbin 191 resulting from deformation of the gradient magnetic field coil conductor to electrical energy, or as the actuator and the detection device. Further, a piezoelectric device as a detection device may be disposed in the proximity of the piezoelectric device 130 having the structure described above, in addition to the piezoelectric device 130. In such a case, too, a plurality of piezoelectric devices as the detection device are preferably disposed dispersedly inside the bobbin in the same way as the piezoelectric device 130 shown in FIG. 7, and low vibration and low noise can be accomplished more effectively.

The piezoelectric device 130 is connected to a control unit and a power supply, not shown in the drawing. The control unit drives the power supply on the basis of information on the electromagnetic force to be cancelled and applies a voltage as electrical energy so that the piezoelectric device generates mechanical energy which cancels the electromagnetic force. This information on the electromagnetic force can be obtained by the piezoelectric device for converting mechanical energy to electrical energy and detecting the deformation quantity of the bobbin. Electrical energy of the piezoelectric device which detects the deformation quantity of the bobbin is sent as an electric signal to the control unit and is used for controlling and driving the piezoelectric device which converts electrical energy to mechanical energy. Gradient magnetic field driving information (gradient magnetic field intensity, timing) from the sequencer can be utilized as information on the electromagnetic force.

FIG. 10 shows the structure of the gradient magnetic field coil according to the fourth embodiment of the present invention. In this embodiment, each piezoelectric device 130c is disposed in the FRP bobbin 191 of the gradient magnetic field coil through intermediate members 142a, 142b, and its direction of polarization is vertical to the bobbin 191. The other structure of the gradient magnetic field coil is the same as that of the gradient magnetic field coil shown in FIG. 7, and it comprises the X gradient magnetic field coil conductor, the Y gradient magnetic field coil conductor and the Z gradient magnetic field coil conductor for generating the magnetic fields which change linearly in the X, Y and Z directions, respectively, and the FRP bobbin 191 for retaining them.

Figure 11:
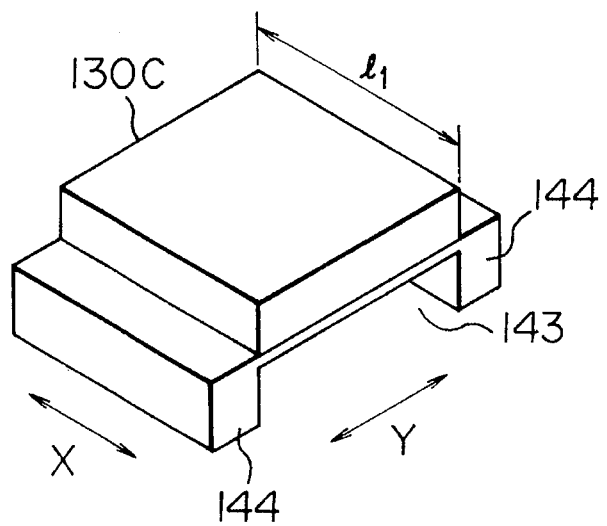
FIG. 11 is a perspective view of an intermediate member.

As shown in FIG. 11, each intermediate member 142a, 142b is substantially rectangular, has a recess 143 at the central portion on the side on which it is fixed to the bobbin 191, and has protuberances 144 at both of its ends which are bonded to the bobbin 191 by an adhesive having less damping. The end portion of each intermediate member 142a, 142b in a direction crossing both end portions is a free end. The protuberance 144 of the intermediate member 142a is bonded in the axial direction (Z direction) and the protuberance 144 of the intermediate member 142b is bonded in the circumferential direction of the bobbin.

The intermediate members 142a, 142b are formed from the synthetic resin and are capable of easily undergoing deformation in the direction of the protuberances 144, 144 (in the Y direction in FIG. 11). However, they hardly undergo deformation in the X direction due to the rigidity of the protuberances 144. Accordingly, deformation of the piezoelectric device 130 is transmitted unidirectionally, that is, only in the Y direction, to the bobbin.

The piezoelectric devices of the third and fourth embodiments are controlled in the same way as the piezoelectric devices of the first and second embodiments.

Figure 12B:
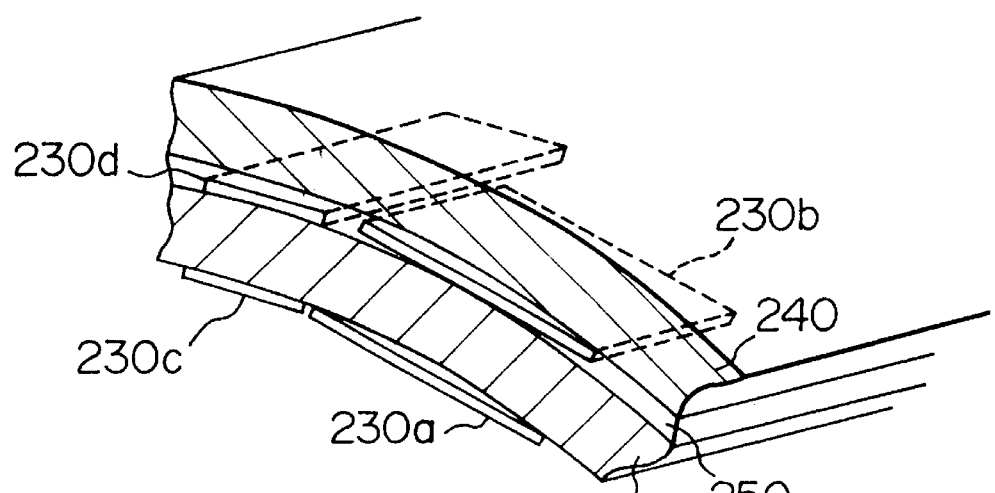
FIG. 12B is a partial enlarged perspective view of the gradient magnetic field generation apparatus.
Figure 12A:
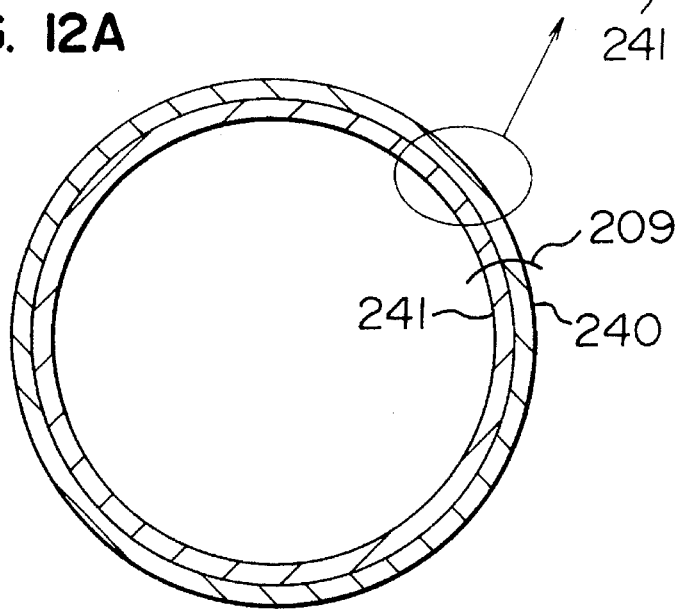
FIG. 12A is a sectional view of a gradient magnetic field generation apparatus according to the fifth embodiment.

FIG. 12A is a sectional view of a cylindrical gradient magnetic field coil according to the fifth embodiment of the present invention, and FIG. 12B is its partial enlarged view. In this embodiment, the gradient magnetic field coil 209 has the structure wherein the gradient magnetic field coil conductor 240 for generating the magnetic fields which linearly change in the X, Y and Z directions and the FRP bobbin 241 as a retaining member for retaining them are laminated, and the coil conductor 240 is fixed to the bobbin 241 by the adhesive 251 or by screw-fixing. Incidentally, though the drawings show the structure comprising one each gradient magnetic field coil conductor 240 and the bobbin 241, the gradient magnetic field coil conductors in the X, Y and Z directions may be formed in the different layers in practice.

The piezoelectric devices 230a and 230c are disposed inside the bobbin 241 of such a gradient magnetic field coil, and the piezoelectric devices 230b and 230d are disposed between the bobbin 241 and the coil conductor 240. These piezoelectric devices 230a to 230d are bonded to the bobbin 241 by an adhesive having less damping. Alternatively, the piezoelectric devices may be fixed to the resin which molds the outer shape of the coil.

Generally, the piezoelectric device has greater conversion efficiency in the direction of polarization than in other directions. Accordingly, when a voltage is applied to the piezoelectric device, a strain (force) can be applied in only the direction of polarization, and a piezoelectric device whose direction of polarization is in parallel with the plane on which the piezoelectric device is disposed (fixed) is preferably employed. By the way, piezoelectric devices generally have the direction of polarization thereof in the direction of thickness and in such a case, a strain (force) can be imparted in only a desired resultant force direction by expanding the width of the piezoelectric device in a direction crossing orthogonally the desired resultant force direction than in the other directions. Further, when the resultant force is small, a great resultant force can be obtained by laminating a large number of piezoelectric devices in the direction of thickness.

In the embodiment shown in the drawing, the piezoelectric devices 230a and 230b are so disposed as to interpose the bobbin 241 between them or in other words, with the gaps between them in the lamination direction, so that their direction of polarization is in alignment with the axial direction of the cylinder. Further, they form a pair. On the other hand, the piezoelectric devices 230c and 230d are so disposed as to interpose the bobbin between them so that the direction of polarization is in alignment with the circumferential direction of the cylinder. Also, they form a pair. By the way, only one set of the piezoelectric device pairs, i.e., the piezoelectric devices 230a and 230b and the piezoelectric devices 230c and 230d, are shown in the drawing, but a plurality of sets of such piezoelectric device pairs are preferably and dispersedly disposed in the circumferential and axial directions so that the arrangement of the pairs having different directions of polarization appear alternately in the circumferential direction. In this way, low vibration and low noise can be accomplished more effectively. When information on deformation of the bobbin 241 is given in advance, the piezoelectric device or devices can be selectively disposed at the positions at which the bobbin 241 is particularly likely to undergo deformation.

In the construction described above, about ½ of the sum of the voltages applied to the pair of piezoelectric devices 230a, 230b is proportional to the simple compressive force or the tensile force occurring in the direction of polarization, and about ½ of the difference of the voltages applied to the pair of piezoelectric devices 230a, 230b is proportional to the moment force. In other words, when +x1 (V) is applied to the piezoelectric device 230a and +x2 (V) is applied to the piezoelectric device 230b, the compressive force (tensile force) acting on the bobbin is $+(x1+x2)/2$ and the moment force is $(x1-x2)/2$. Accordingly, the moment force does not occur when $x1=x2$, and the compressive force (tensile force) does not occur when $x1=-x2$.

Figure 13A:
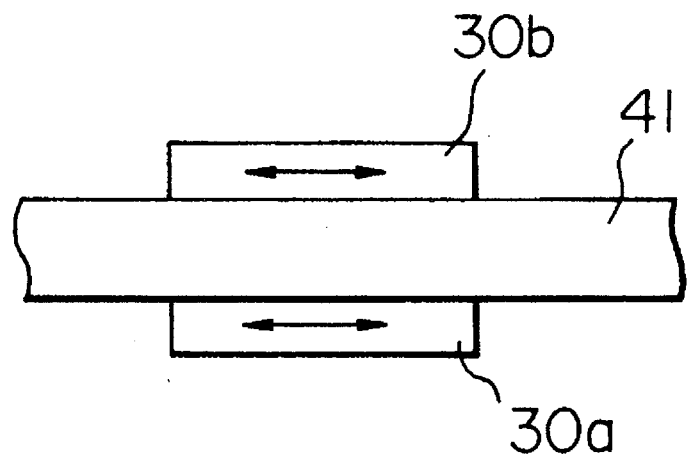
FIGS. 13A and 13B are explanatory views useful for explaining the operation of the piezoelectric device.
Figure 13B:
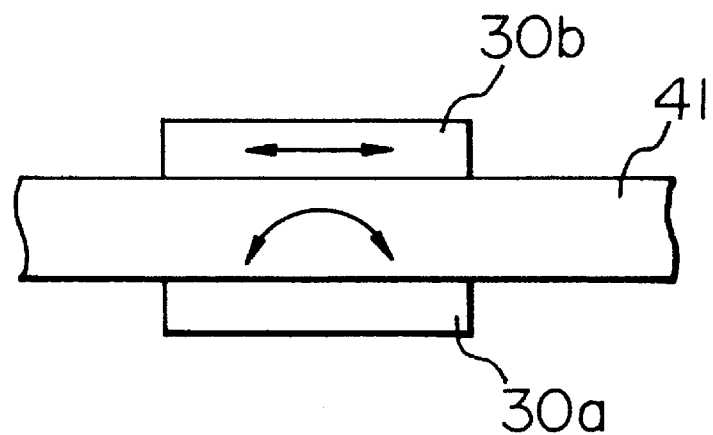

FIGS. 13A and 13B schematically show the operation of such a piezoelectric device. When the same voltage having the same polarity is simultaneously applied to the pair of piezoelectric devices $230a$, $230b$ ($x1=x2$), the simple compressive force or the tensile force occurs in the circumferential direction as shown in FIG. 13a and the simple compressive force or the tensile force in the opposite direction, that occurs in the axial direction of the bobbin 241, can be restricted. When a voltage having mutually opposite polarities is applied to the pair of piezoelectric devices $230a$, $230b$, the moment force occurs in the axial direction as shown in FIG. 13B and can offset the moment force occurring in the bobbin 241 in the opposite direction. Similarly, the simple compressive force or the tensile force or the moment force of the bobbin in the circumferential direction can be restricted for the pair of piezoelectric devices $230c$, $230d$.

When the gradient magnetic field coil is driven and the gradient magnetic field coil conductor undergoes deformation due to the electromagnetic force acting on the gradient magnetic field coil conductor 240, the simple compressive force, the tensile force and the moment force act compositely on the bobbin 241 in both circumferential and axial directions, but the voltages applied to the first and second piezoelectric devices $230a$, $230b$ or the piezoelectric devices $230c$, $230d$ are controlled by the later-appearing piezoelectric device control means in such a manner as to generate the forces in opposite directions to these forces. In this way, vibration resulting from the simple compressive force and the tensile force and vibration resulting from the moment force can be effectively suppressed in each direction.

In the embodiment shown in the drawing, the first and second piezoelectric devices are so disposed vertically as to interpose the bobbin 241 between them, but they may be disposed with a gap between them in the lamination direction. For example, they may be disposed on the outermost layer and the innermost layer of the cylinder, or may be disposed between the bobbin 241 and the coil conductor 240 and on the outermost layer.

The embodiment given above explains the case where the piezoelectric device functions as the actuator, but the piezoelectric device can be used as a sensor for detecting deformation of the gradient magnetic field coil by the same arrangement. In such as case, deformation can be detected by the polarity and magnitude of the voltage occurring between a pair of piezoelectric devices by deformation (compression, elongation) of the portion interposed between the piezoelectric devices. Further, the piezoelectric device can also function simultaneously as the actuator and the sensor. In this case, a plurality of piezoelectric devices as the sensors are preferably dispersed inside the bobbin in the same way as the piezoelectric device shown in FIG. 12B, and low vibration and low noise can be accomplished more effectively.

Figure 14B:
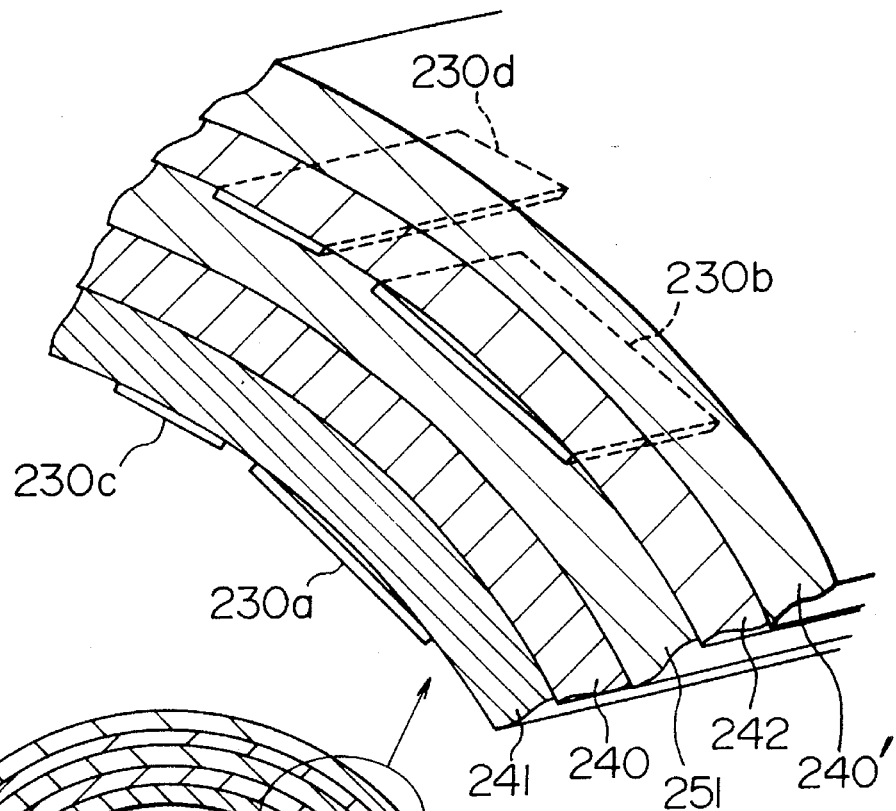
FIG. 14B is a partial enlarged perspective view of FIG. 14A.
Figure 14A:
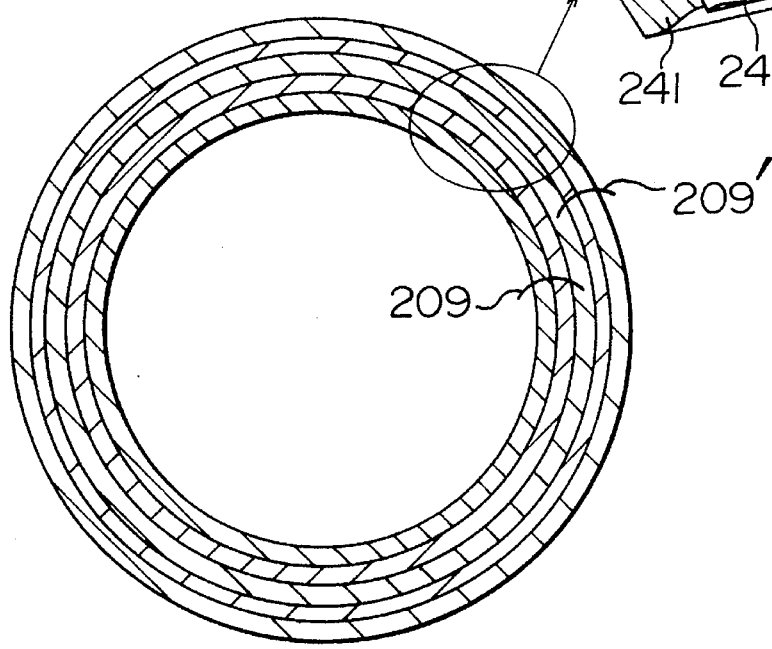
FIG. 14A is a sectional view of a gradient magnetic field generation apparatus of a modified embodiment of the fifth embodiment.

FIGS. 14A and 14B show the structure of the gradient magnetic field coil according to the sixth embodiment. This embodiment, too, deals with the cylindrical gradient magnetic field coil, which comprises a main gradient magnetic field coil (hereinafter referred to as the "main coil") 209 and a shield coil 209'. Each of the main coil 209 and the shield coil 209' comprises a coil conductor 240, 240' for generating the magnetic field which linearly changes in the X, Y and Z directions and a bobbin (main bobbin 241, shield bobbin 242) as a retaining member for retaining the coil conductor 240, 240'. The coil conductors 240 and 240' are fixed to the inner peripheral surface of the main bobbin 241 and the shield bobbin 242 by an epoxy resin adhesive, for example, respectively, and the coil conductor 240 of the main coil 209 and the bobbin 242 of the shield coil 209' are connected by a resin 251 with high rigidity and are integrated as a whole.

In the gradient magnetic field coil described above, the first piezoelectric devices $230a$, $230c$ are fixed to the inside of the bobbin and the second piezoelectric devices $230b$, $230d$ are fixed to the inside of the shield bobbin 242. The piezoelectric devices $230a$ and $230b$ are disposed with gaps between them in the lamination direction, and the piezoelectric devices $230c$ and $230d$ are disposed with a gap between them in the lamination direction. The direction of polarization of the piezoelectric devices $230a$, $230b$ exist in the axial direction and that of the piezoelectric devices $230c$, $230d$ exists in the circumferential direction in the same way as in the fifth embodiment, and a plurality of pairs are dispersedly disposed in the cylindrical gradient magnetic field coil.

In this embodiment, too, when the magnitudes and polarities of the voltages applied to the pairs of piezoelectric devices disposed with gaps in the lamination direction are appropriately controlled in the same way as in the fifth embodiment, the simple compressive force and the tensile force or the moment force is allowed to act on the bobbin and the coil conductor portions interposed between the piezoelectric devices, and vibration occurring at the time of driving of the gradient magnetic field coil can be cancelled.

The piezoelectric devices of the fifth and sixth embodiments are controlled in the same way as the piezoelectric devices of the first and second embodiments.

Figure 15B:
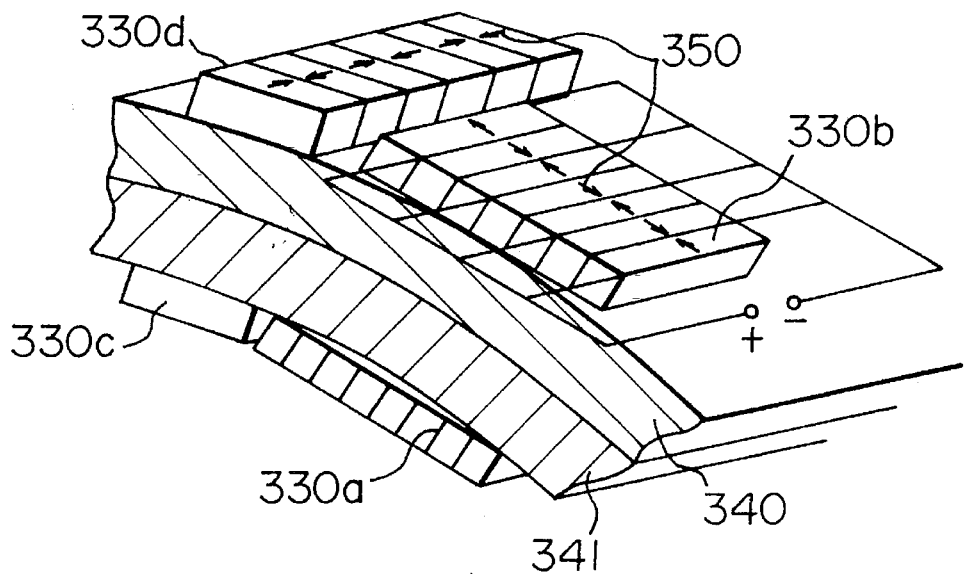
FIG. 15B is a partial enlarged perspective view of FIG. 15A.
Figure 15A:
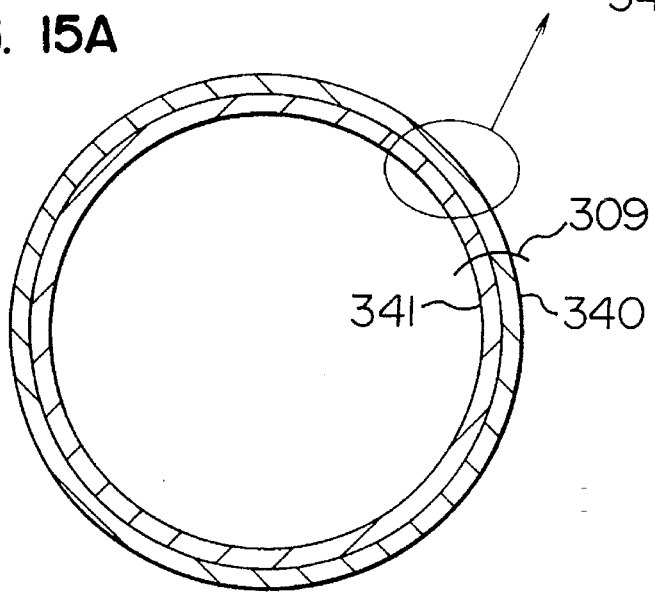
FIG. 15A is a sectional view of a gradient magnetic field generation apparatus according to the sixth embodiment.

FIG. 15A is a sectional view of the cylindrical gradient magnetic field coil according to the seventh embodiment of the present invention, and FIG. 15B is its partial enlarged view. In this embodiment, the gradient magnetic field coil 309 has a structure wherein the gradient magnetic field coil conductor 340 for generating the magnetic field which changes linearly in the X, Y and Z directions and the FRP bobbin 341 as a retaining member for retaining them are laminated, and the coil conductor 340 is fixed to the bobbin 341 by bonding by the adhesive or screw-fixing. Incidentally, though the drawings show the structure which comprises only one each gradient magnetic field coil conductor 340 and bobbin 341, the gradient magnetic field coil conductors for the X, Y and Z directions may be formed in different layers.

The piezoelectric devices $330a$ and $330c$ are disposed inside the bobbin 341 of such a gradient magnetic field coil and the piezoelectric devices $330b$ and $330d$ are disposed outside the coil conductor 340. These piezoelectric devices $330a$ to $330d$ are bonded to the coil conductor 340 by an adhesive having less damping. Alternatively, the piezoelectric devices may be fixed to the resin which molds the outside of the coil.

These piezoelectric devices 330 ($330a$ to $330d$) comprise thin sheet-like laminate members laminated in the direction of polarization 350, and each electrode having substantially the same area is sandwiched between the piezoelectric devices 30. The laminate members are laminated in such a fashion that the direction of polymerization alternately exists in the opposite directions. The piezoelectric devices 330 of every other layer are electrically connected in parallel by external electrodes and undergo deformation in the same direction even when the voltage of the boundary surface between the adjacent piezoelectric devices is the same.

Moreover, because a large number of piezoelectric devices are laminated, great conversion energy can be obtained in the direction of polarization due to the vertical effect.

Piezoelectric ceramics causing the piezoelectric phenomenon such as $BaTiO_3$ system, $PbZrO_3$-$PbTiO_3$ system, etc., can be suitably used as the piezoelectric device.

To cope with complicated deformation of the gradient magnetic field coil, the piezoelectric devices having different directions of polarization are preferably combined with one another and are used. The embodiment shown in the drawing uses the piezoelectric devices 330a, 330b which are disposed so that the direction of their polarization is in alignment with the circumferential direction of the cylinder, and the piezoelectric devices 330c, 330d which are disposed so that the direction of their polarization is in alignment with the axial direction of the cylinder.

Further, only one of the piezoelectric devices 330a and 330b and only one of the piezoelectric devices 330c and 330d may be disposed in one direction (in the axial direction or the circumferential direction of the cylinder) but preferably, the piezoelectric devices 330a and 330b form a pair while the piezoelectric devices 330c and 330d form a pair, and these pairs are disposed in such a manner as to interpose the coil conductor 340 and the bobbin 341 between them or in other words, with a gap between them in the radial direction of the coil, as shown in the drawing. According to such an arrangement, not only the simple compressive force or the tensile force in the planar direction of the piezoelectric device but also the moment force can be imparted (see FIGS. 13A and 13B).

Incidentally, the drawing shows the arrangement wherein the piezoelectric devices 330a, 330c are disposed inside the bobbin 341 and the piezoelectric devices 330b, 330d are disposed outside the coil conductor 340. To obtain the function described above, however, the pair of piezoelectric devices need only be disposed with the gap between them in the radial direction. Accordingly, the piezoelectric devices 330a, 330c or the piezoelectric devices 330b, 330d may be disposed between the coil conductor 340 and the bobbin 341, for example.

Further, the drawing shows only one each pair of piezoelectric devices 330a, 330b and 330c, 330d, but preferably, a plurality of pairs of piezoelectric devices having different directions of polarization are disposed without a substantial gap between them in both circumferential and axial directions so that their arrangement in the circumferential direction becomes alternate. According to such an arrangement, low vibration and low noise can be accomplished more effectively. When the information on deformation of the bobbin 341 is in advance given, the piezoelectric devices can be selectively disposed at positions at which the bobbin 341 is particularly likely to undergo deformation. The pairs of piezoelectric devices 330a, 330b or the pairs of piezoelectric devices 330c, 330d may be disposed without substantial gap between the pairs on the entire surface of the bobbin.

Figure 16B:
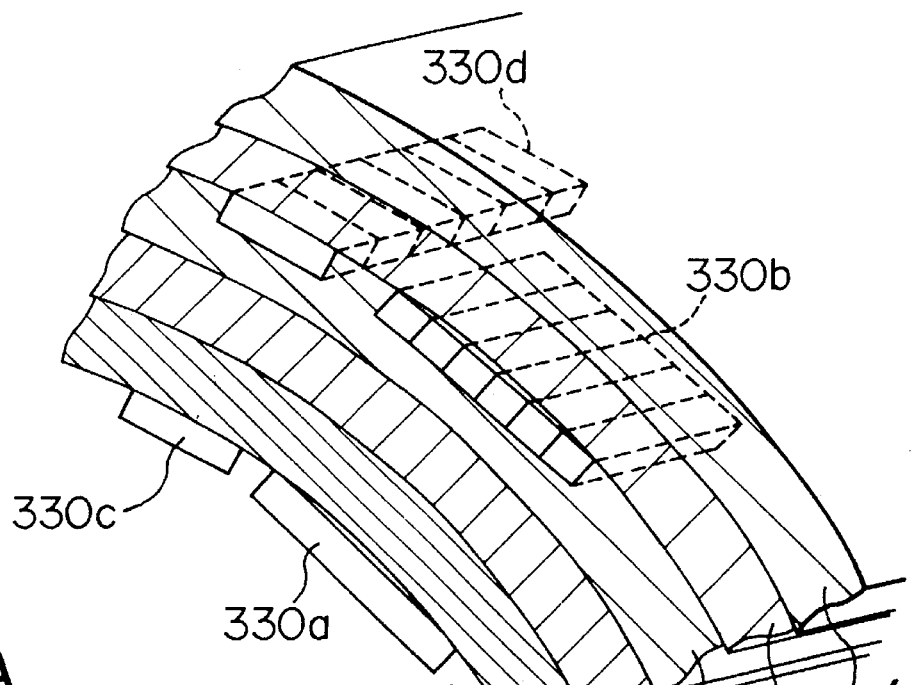
FIG. 16B is a partial enlarged perspective view of FIG. 16A.
Figure 16A:
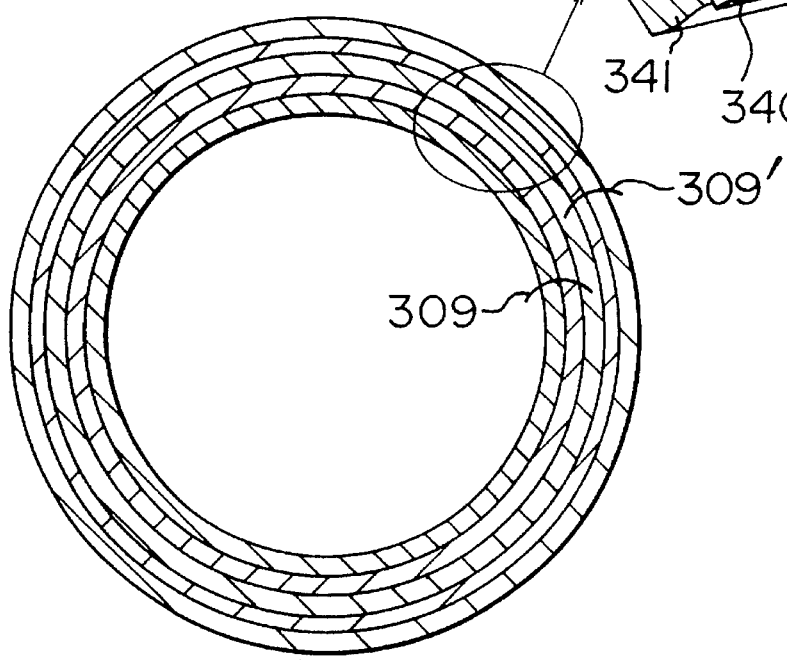
FIG. 16A is a sectional view of a gradient magnetic field generation apparatus according to the seventh embodiment.

Next, the explanation will be given on the embodiment wherein the present invention is applied to a gradient magnetic field coil equipped with a main gradient magnetic field coil as the gradient magnetic field coil and a shield coil for generating a gradient magnetic field which offsets the outside magnetic field generated by the main gradient magnetic field coil. FIGS. 16A and 16B show the structure of such a gradient magnetic field coil. In this example, too, the coil is the cylindrical gradient magnetic field coil, which comprises a main gradient magnetic field (hereinafter referred to as the "main coil") 309 and the shield coil 309'. Each of the main coil 309 and the shield coil 309' comprises a coil conductor 340, 340' for generating the magnetic field which linearly changes in X, Y and Z directions, and a bobbin (main bobbin 341, shield bobbin 342) as a retaining member for retaining these coil conductors 340, 340'. The coil conductors 340, 340' are fixed to the outer periphery of the main bobbin 341 and the shield bobbin 342 by an epoxy resin adhesive, for example, and the coil conductor 340 of the main coil 309 and the bobbin 342 of the shield coil 309' are connected by a resin 351 with high rigidity and are integrated as a whole.

In the gradient magnetic field coil described above, the piezoelectric devices 330a, 330c are fixed to the inside of the bobbin 341 and the piezoelectric devices 330b, 330d are fixed to the inside of the shield bobbin 342. The piezoelectric devices 330a and 330b are disposed with a gap between them in the radial direction of the coil while the piezoelectric devices 330c and 330d are disposed with a gap in the radial direction. In the same way as in the embodiment shown in FIG. 15, the direction of polarization of the piezoelectric devices 330a, 330b exists in the circumferential direction, and that of the piezoelectric devices 330c, 330d exists in the axial direction. A plurality of these electrode pairs are dispersedly disposed in the cylindrical gradient magnetic field coil.

This embodiment, too, uses the piezoelectric devices which are laminate members laminated in the direction of polarization in the same way as the embodiment shown in FIG. 15, can generate large mechanical energy in the direction of polarization and can effectively cancel the vibration which occurs at the time of driving of the gradient magnetic field coil.

In the construction shown in FIG. 16, too, the piezoelectric device can be allowed to function as the device for converting electrical energy to mechanical energy or as the device for converting mechanical energy to electrical energy or as the device having both of these functions. As to the arrangement of the piezoelectric devices, a pair of piezoelectric devices are preferably disposed with a gap between them in the radial direction, but from the gist of the present invention, either one of them may be disposed, and the invention is not particularly limited to the arrangements shown in the drawings.

Next, the eighth embodiment of the present invention, which relates to an MRI apparatus using energy conversion devices laminated in such a manner that the direction of polarization of the piezoelectric devices is orthogonal to the planar direction of the plane on which the laminated members are disposed, will be explained.

Figure 17:
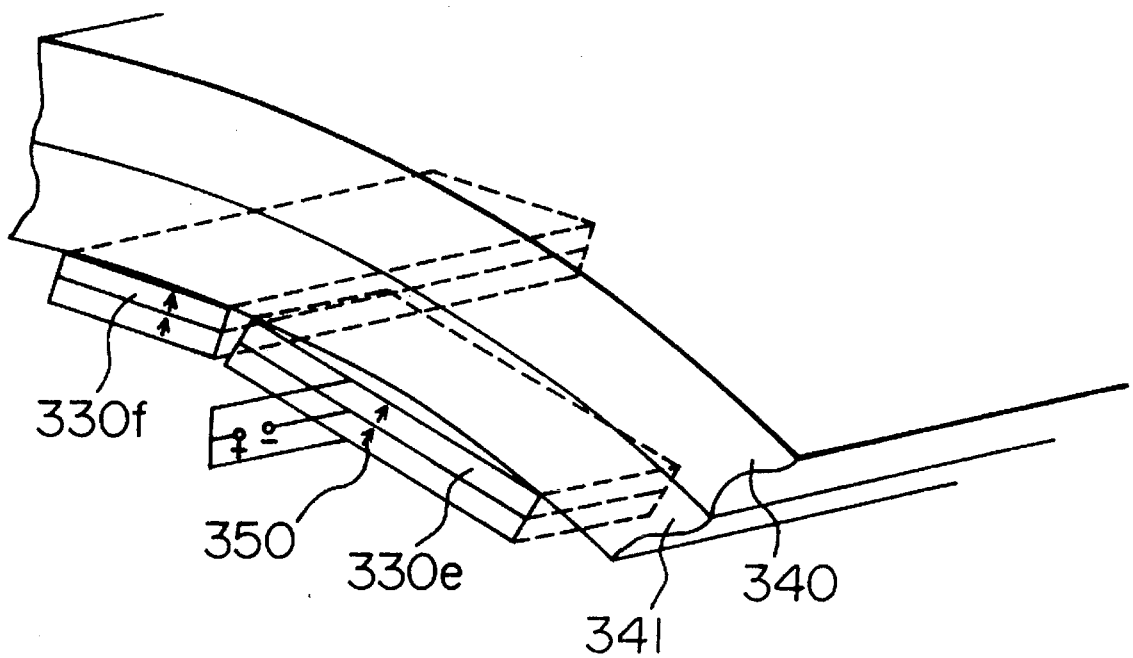
FIG. 17 is a perspective view showing a gradient magnetic field generation apparatus according to the eighth embodiment.

FIG. 17 is a partial enlarged view of the gradient magnetic field coil having such a structure. Rectangular piezoelectric devices 330e, 330f are disposed inside the bobbin 341 of the gradient magnetic field coil comprising the coil conductor 340 and the bobbin 341. Since the rest of the construction are the same as those of the gradient magnetic field coil shown in FIG. 15, their explanation will be omitted. Each of the piezoelectric devices 330e, 330f is produced by laminating two piezoelectric devices in the direction of their polarization 350. The piezoelectric device 330e is disposed in such a manner that the longitudinal direction thereof is in alignment with the circumferential direction of the cylinder, while the piezoelectric device 330f is disposed in such a manner that the longitudinal direction thereof is in alignment with the axial direction of the cylinder. They suppress the moment force in the circumferential or axial direction of the gradient magnetic field coil by utilizing the piezoelectric transverse effect.

These two piezoelectric devices are laminated in such a manner that the direction of polarization becomes the same, and are connected to electrodes so that positive and negative voltages can be applied. Accordingly, when the voltage is applied to the piezoelectric devices, one of the piezoelectric devices is driven in the extending direction while the other is driven in the contracting direction. In this way, the moment force can be applied to the piezoelectric device as the laminate member. This principle is the same as the one shown in FIG. 13 and in this case, the moment force can be imparted by using only one laminate member. The resulting moment force in a transverse direction in the rectangular piezoelectric device is greater than that in the longitudinal direction. For this reason, in the case of the piezoelectric device 330e disposed in such a manner that its longitudinal direction lies in the circumferential direction, the greater moment force can be obtained in the axial direction. And in the case of the piezoelectric device 330f disposed in such a manner that its longitudinal direction lies in the axial direction, the greater moment force can be obtained in the circumferential direction. Accordingly, deformation of the bobbin 341 can be suppressed and vibration and noise can be cancelled by driving the piezoelectric devices in such a manner as to offset the moment force occurring in the bobbin 341 to which the piezoelectric devices are bonded.

Though the drawing shows the case where the piezoelectric devices are disposed inside the bobbin 341, they may be disposed between the bobbin and the coil or outside the coil. Further, a pair of piezoelectric devices may be disposed with a gap between them in the radial direction in the same way as in the embodiment shown in FIG. 15, or the arrangement of the piezoelectric devices shown in FIG. 15 may be suitably combined with the arrangement of the piezoelectric devices shown in FIG. 17.

Needless to say, the eighth embodiment can be also applied to the gradient magnetic field coil equipped with the shield coil 309' shown in FIG. 16.

The eighth embodiment shown in FIG. 17 represents the case where positive and negative, reverse voltages are applied to the two piezoelectric devices laminated in such a manner that the directions of their polarization become the same. However, it is possible to laminate a plurality of piezoelectric devices, whose direction of polarization exists in the direction orthogonally crossing the plane of disposition, in the direction of polarization, to connect the electrodes so that the voltage having the same polarity can be applied to these piezoelectric devices, and to cause deformation in the same direction, in the same way as in FIG. 17.

The piezoelectric devices of the seventh and eighth embodiments are controlled in the same way as the piezoelectric devices of the first and second embodiments.

The present invention has been described in detail, it should be understood that various changes, substitutions and alterations can be made hereto without departing from the spirit and scope of the present invention as defined by the appended claims.

We claim:

1. A quiet MRI (magnetic resonance imaging) apparatus comprising:

static magnetic field generation means for generating a static magnetic field in a space in which an inspection object is placed;

gradient magnetic field generation means for generating a gradient magnetic field in said space, equipped with at least one gradient magnetic field coil and a retaining member for said coil, wherein said retaining member of said coil undergoes deformation and vibration by electromagnetic force when a current is caused to flow through said coil;

transducer means fixed to said retaining member of said coil, for generating a force inhibiting deformation of said retaining member to inhibit substantially vibration of said retaining member;

means for applying a radio frequency magnetic field to said inspection object;

means for detecting nuclear magnetic resonance signals from said inspection object; and means for reconstructing an image expressing said inspection object on the basis of said magnetic resonance signals.

2. An MRI apparatus according to claim 1, wherein said transducer means comprises a piezoelectric device fixed to said retaining member and voltage control means for applying a voltage to said piezoelectric device in synchronism with a current applied to said gradient magnetic field coil, and said piezoelectric device to which said voltage is applied undergoes deformation, generates and applies said force to said retaining member and at least substantially inhibits vibration of said retaining member.

3. An MRI apparatus according to claim 2, wherein said voltage control means controls said voltage in accordance with a predetermined rule by referring to the current applied to said gradient magnetic field coil.

4. An MRI apparatus according to claim 2, wherein said voltage control means controls said voltage in accordance with a predetermined sequence so determined as to correspond to a sequence of a current applied to said gradient magnetic coil.

5. An MRI apparatus according to claim 2, further comprises means for detecting deformation of said retaining member, and wherein said voltage control means controls said voltage on the basis of the detection result of said deformation detection means.

6. An MRI apparatus according to claim 5, wherein said detection means is said piezoelectric device, said piezoelectric device is further equipped with means for outputting a voltage signal corresponding to deformation of said retaining member and storage means for storing said voltage signal, and said voltage control means controls said voltage by referring to said voltage signal stored in said storage means.

7. An MRI apparatus according to claim 2, wherein a plurality of said piezoelectric devices are provided, said piezoelectric devices are fitted without substantial gaps throughout a full zone of said retaining member, and said voltage control means individually applies the voltage to each of said piezoelectric devices or groups of said piezoelectric devices grouped in accordance with a predetermined relation.

8. An MRI apparatus according to claim 7, wherein a preferential deformation direction of at least one of said piezoelectric devices is in parallel with said retaining member.

9. An MRI apparatus according to claim 7, wherein a first piezoelectric device has a preferential deformation direction which coincides with the axial direction of said retaining member and a second piezoelectric device has a preferential deformation direction which coincides with the circumferential direction of said retaining member and said first and second piezoelectric devices are alternately disposed.

10. An MRI apparatus according to claim 7, wherein at least one of said piezoelectric devices has a wide portion and a narrow portion with the direction of polarization thereof lying in the normal direction of said retaining member, and a preferential deformation direction of said at least one of said piezoelectric devices lies in a direction in which said narrow portion expands.

11. An MRI apparatus according to claim 7, wherein the direction of polarization of at least one of said piezoelectric devices is in parallel with said retaining member and is a preferential deformation direction thereof.

12. An MRI apparatus according to claim 7, wherein at least one of said piezoelectric devices is constituted by laminating a plurality of piezoelectric device units the direction of polarization of which is in parallel with said retaining member.

13. An MRI apparatus according to claim 12, wherein a plurality of said piezoelectric device units comprise first units the direction of polarization of which lies in a first direction and second units the direction of polarization of which lies in the opposite to that of said first units, said first units and said second units are alternately laminated, and voltages in mutually opposite directions are applied to said first and second units, respectively.

14. An MRI apparatus according to claim 8, wherein at least one pair of piezoelectric devices the preferential deformation directions of which are coincident are disposed in the direction of thickness of said retaining member.

15. An MRI apparatus according to claim 14, wherein at least one pair of said piezoelectric devices is disposed in such a manner as to interpose said retaining member between them.

16. An MRI apparatus according to claim 14, wherein at least one pair of said piezoelectric devices is disposed in superposition on one of the surfaces of said retaining member.

17. An MRI apparatus according to claim 7, wherein at least one pair of said piezoelectric devices is fixed to said retaining member through an intermediate member, and said intermediate member expands and contracts in only a first direction which is substantially in parallel with said retaining member.

18. An MRI apparatus according to claim 7, wherein said piezoelectric devices comprise a first group fixed to a first intermediate member capable of expanding and contracting in only the axial direction of said retaining member and a second group fixed to a second intermediate member capable of expanding and contracting in only the circumferential direction of said retaining member, and said first and second intermediate members are alternately fixed to said retaining member.

19. An MRI apparatus according to claim 7, wherein at least one pair of said piezoelectric devices is molded into said retaining member.

20. An MRI apparatus according to claim 19, wherein said at least one of said piezoelectric device is fixed to said retaining member at a pair of edges opposing each other on one of the surfaces thereof, and said retaining member has a region for escaping the other portions of said piezoelectric device, so that a force is applied from said piezoelectric device to said retaining member in only the direction of said pair of edges.

21. A quiet MRI (magnetic resonance imaging) apparatus comprising:

a main magnet for generating a static magnetic field in a space in which an inspection object is placed;

a gradient magnetic field coil for generating a gradient magnetic field in said space;

a bobbin for supporting said gradient magnetic field coil, said bobbin undergoing deformation and vibration by an electromagnetic force generated when a current is caused to flow through said gradient magnetic field coil;

a piezoelectric device fixed to said bobbin;

voltage control circuits for applying voltages which cause deformation of said piezoelectric device in such a manner as to at least inhibit vibration due to said electromagnetic force, to said piezoelectric device;

a radio frequency coil for applying a radio frequency magnetic field to said inspection object;

a detection coil for detecting magnetic resonance signals from said inspection object;

a circuit for reconstructing an image on the basis of said magnetic resonance signals; and a display device for displaying said image.

22. A quiet magnetic resonance imaging (MRI) apparatus comprising:

static magnetic field generation means for generating a static magnetic field in a space in which an inspection object is placed;

gradient magnetic field generation means for generating a gradient magnetic field in said space, including a least one gradient magnetic field coil and a retaining member of said coil, said gradient magnetic field generation means undergoing deformation and vibration by an electromagnetic force generated when a current is caused to flow through said coil;

transducer means fixed to said gradient magnetic field generation means, for generating and applying a force which inhibits vibration of said gradient magnetic field generation means, to said gradient magnetic field generation means to at least substantially inhibit vibration of said gradient magnetic field generation means;

means for applying a radio frequency magnetic field to said inspection object;

means for detecting magnetic resonance signals from said inspection object; and means for reconstructing an image expressing said inspection object on the basis of said magnetic resonance signals.

23. A gradient magnetic field generation apparatus for a magnetic resonance imaging (MRI) apparatus, comprising:

a gradient magnetic field coil for generating a gradient magnetic field in a space in which an inspection object is placed;

a retaining member for retaining said coil; and means fixed to said retaining member, for generating and applying a force which inhibits deformation of said retaining member to at least substantially inhibit vibration of said retaining member.

24. A gradient magnetic field generation apparatus according to claim 23, wherein said transducer means comprises at least one piezoelectric device fixed to said retaining member and voltage control means for applying a voltage to said piezoelectric device in synchronism with a current applied to said gradient magnetic field coil, whereby said piezoelectric device to which said voltage is applied undergoes deformation, generates and applies said force to said retaining member, and at least substantially inhibits vibration of said retaining member.

25. A gradient magnetic field generation apparatus according to claim 24, wherein a plurality of piezoelectric devices are provided and are fitted without substantial gaps through a full zone of said retaining member, and said voltage control means applies independently a voltage to each of said piezoelectric devices or to groups of said piezoelectric devices grouped in accordance with a predetermined relation.

26. A gradient magnetic field generation apparatus according to claim 25, wherein a preferential deformation direction of at least one of said piezoelectric devices is in parallel with said retaining member.

27. A gradient magnetic field generation apparatus according to claim 25, wherein first piezoelectric devices have a preferential deformation direction which coincides with an axial direction of said retaining member and second piezoelectric devices have a preferential deformation direction which coincides with a circumferential direction of said retaining member are alternately disposed.

28. A gradient magnetic field generation apparatus according to claim 25, wherein said at least one of piezoelectric devices is molded in said retaining member.

29. A silencing/vibration-proofing apparatus for a gradient magnetic field generation apparatus for generating a gradient magnetic field in a space in which an inspection object is placed, said gradient magnetic field generation apparatus including at least one gradient magnetic field coil and a retaining member of said coil, said retaining member undergoing deformation and vibration by an electromagnetic force generated when a current is caused to flow through said coil, said silencing/vibration-proofing apparatus comprising:

a piezoelectric device fixed to said retaining member; and voltage control means for applying a voltage to said piezoelectric device in synchronism with said current applied to said gradient magnetic field coil;

wherein said piezoelectric device to which said voltage is applied undergoes deformation, applies a force to said retaining member to at least substantially inhibit vibration of said retaining member so that sound and vibration from said gradient magnetic field generation means are effectively suppressed.

30. A silencing/vibration-proofing apparatus according to claim 29, wherein a plurality of piezoelectric devices are provided and are fitted without substantial gaps to a full zone of said retaining member, and said voltage control means applies independently a voltage to each of said piezoelectric devices or to groups of said piezoelectric devices grouped in accordance with a predetermined relation.

31. A silencing/vibration-proofing apparatus according to claim 30, wherein a preferential deformation direction of at least one of said piezoelectric devices is in parallel with said retaining member.

32. A silencing/vibration-proofing apparatus according to claim 30, wherein first piezoelectric devices have a preferential deformation direction which coincides with an axial direction of said retaining member and second piezoelectric devices have a preferential deformation direction which coincides with a circumferential direction of said retaining member are alternately disposed.

33. A silencing/vibration-proofing apparatus according to claim 30, wherein said piezoelectric device is molded in said retaining member.

34. A silencing/vibration-proofing apparatus for a gradient magnetic field generation apparatus for generating a gradient magnetic field in a space in which an inspection object is placed, said gradient magnetic field generation apparatus including at least one gradient magnetic field coil and a retaining member of said coil, said retaining member undergoing deformation and vibration by an piezoelectric force generated when a current is caused to flow through said coil, said silencing/vibration-proofing apparatus comprising:

a piezoelectric device fixed to a bobbin; and voltage control means for applying a voltage which generates deformation of said piezoelectric device in such a manner as to at least inhibit vibration of said retaining member by said electromagnetic force.

35. A piezoelectric device array adopted to a gradient magnetic field generation apparatus, said apparatus including at least one gradient magnetic field coil and a retaining member of said coil, whereby said retaining member of said coil undergoes deformation and vibration by an electromagnetic force by an electromagnetic force generated when a current is caused to flow through said coil, said array comprising:

a plurality of piezoelectric devices disposed in such a manner as to cover a full zone of a portion at which deformation of said retaining member is expected, without substantial gaps; and means for fixing said piezoelectric devices to said retaining means and for controlling said piezoelectric devices to at least substantially inhibit vibration of said retaining member.

36. A piezoelectric device array according to claim 35, wherein a preferential deformation direction of at least one of said piezoelectric devices is in parallel with said retaining member.

37. A piezoelectric device array according to claim 35, wherein first piezoelectric devices have a preferential deformation direction which is in alignment with an axial direction of said retaining member and second piezoelectric devices have a preferential deformation direction which is in alignment with a circumferential direction of said retaining member are alternately disposed.

38. A piezoelectric device array according to claim 35, wherein said fixing means is made of resin, said piezoelectric devices are molded into said fixing means, and said fixing means is bonded to said retaining member without damping.

39. A method of suppressing noise and vibration of a gradient magnetic field generation apparatus including at least one gradient magnetic field coil and a retaining member of said coil which undergoes deformation and vibration by an electromagnetic force generated when a current is caused to flow through said coil, for generating a gradient magnetic field in a space in which an inspection object is placed, said method comprising:

a step of detecting deformation of said retaining member when the current is caused to flow through said coil; and a step of applying a force to said retaining member in a direction in parallel with the planes thereof so as to inhibit said detected deformation and vibration of generating and said retaining member.

40. A method of suppressing noise and vibration of a gradient magnetic field generation apparatus including at least one gradient magnetic field coil and a retaining member of said coil which undergoes deformation and vibration by an electromagnetic force generated when a current is caused to flow through said coil, for generating a gradient magnetic field in a space in which an inspection object is placed, said method comprising:

a step of detecting the current applied to said coil;

a step of determining at least a force in light of a relationship between a current stored in advance and said force in a direction in parallel with planes of said retaining member, said force being necessary for inhibiting deformation and vibration of said retaining member by said current; and a step of applying said force so determined to said retaining member.

41. A method of suppressing noise and vibration of a gradient magnetic field generation apparatus including at least one gradient magnetic field coil and a retaining member of said coil which undergoes deformation and vibration by an electromagnetic force generated when a current is caused to flow through said coil, for generating a gradient magnetic field in a space in which an inspection object is placed, said method comprising:

a step of determining a sequence of currents to be applied to said coil;

a step of determining a sequence of forces to be applied in a direction in parallel with planes of said retaining member in light of a relationship between an application sequence of current stored in advance and said sequence of forces necessary for at least inhibiting vibration of said retaining member; and a step of applying said sequence of forces so obtained to said retaining member.

42. A quiet MRI (magnetic resonance imaging) apparatus comprising:

static magnetic field generation means for generating a static magnetic field in a space in which an inspection object is placed;

gradient magnetic field generation means for generating a gradient magnetic field in said space, equipped with at least one gradient magnetic field coil and a retaining member for said coil, wherein said retaining member of said coil undergoes deformation and vibration by electromagnetic force when a current is caused to flow through said coil;

transducer means fixed to said retaining member of said coil, for applying force, which causes no magnetic gradient field inhibiting deformation of said retaining member to at least inhibit substantially vibration of said retaining member;

means for applying a radio frequency magnetic field to said inspection object;

means for detecting nuclear magnetic resonance signals from said inspection object; and means for reconstructing an image expressing said inspection object on the basis of said magnetic resonance signals.

* * * * *